United States Patent
Nan

(10) Patent No.: US 8,741,755 B2
(45) Date of Patent: Jun. 3, 2014

(54) SEMICONDUCTOR DEVICE HAVING GATE TRENCH AND MANUFACTURING METHOD THEREOF

(76) Inventor: Wu Nan, Tokyo (JP)

( * ) Notice: Subject to any disclaimer, the term of this patent is extended or adjusted under 35 U.S.C. 154(b) by 170 days.

(21) Appl. No.: 13/485,282

(22) Filed: May 31, 2012

(65) Prior Publication Data

US 2012/0309165 A1    Dec. 6, 2012

(30) Foreign Application Priority Data

Jun. 1, 2011  (JP) .................................. 2011-123233

(51) Int. Cl.
    *H01L 21/3205*    (2006.01)
    *H01L 21/4763*    (2006.01)

(52) U.S. Cl.
    USPC ............................. 438/589; 438/270; 438/239

(58) Field of Classification Search
    USPC .................................................. 438/589, 239
    See application file for complete search history.

(56) References Cited

U.S. PATENT DOCUMENTS

| 7,534,686 | B2 | 5/2009 | Lee et al. |
| 7,598,571 | B2 | 10/2009 | Kim et al. |
| 7,867,853 | B2 * | 1/2011 | Mine ............................ 438/270 |
| 2007/0284634 | A1 | 12/2007 | Yokoyama et al. |
| 2011/0143509 | A1 * | 6/2011 | Fujimoto ..................... 438/270 |
| 2013/0264621 | A1 * | 10/2013 | Nishi et al. ................... 257/296 |

FOREIGN PATENT DOCUMENTS

| JP | 2005-64500 | 3/2005 |
| JP | 2007-27753 | 2/2007 |
| JP | 2007-305827 | 11/2007 |

* cited by examiner

*Primary Examiner* — Thien F Tran
(74) *Attorney, Agent, or Firm* — Young & Thompson

(57) ABSTRACT

Disclosed herein is a semiconductor device that includes a trench formed across active regions and the element isolation regions. A conductive film is formed at a lower portion of the trench, and a cap insulating film is formed at an upper portion of the trench. The cap insulating film has substantially the same planer shape as that of the conductive film.

20 Claims, 18 Drawing Sheets

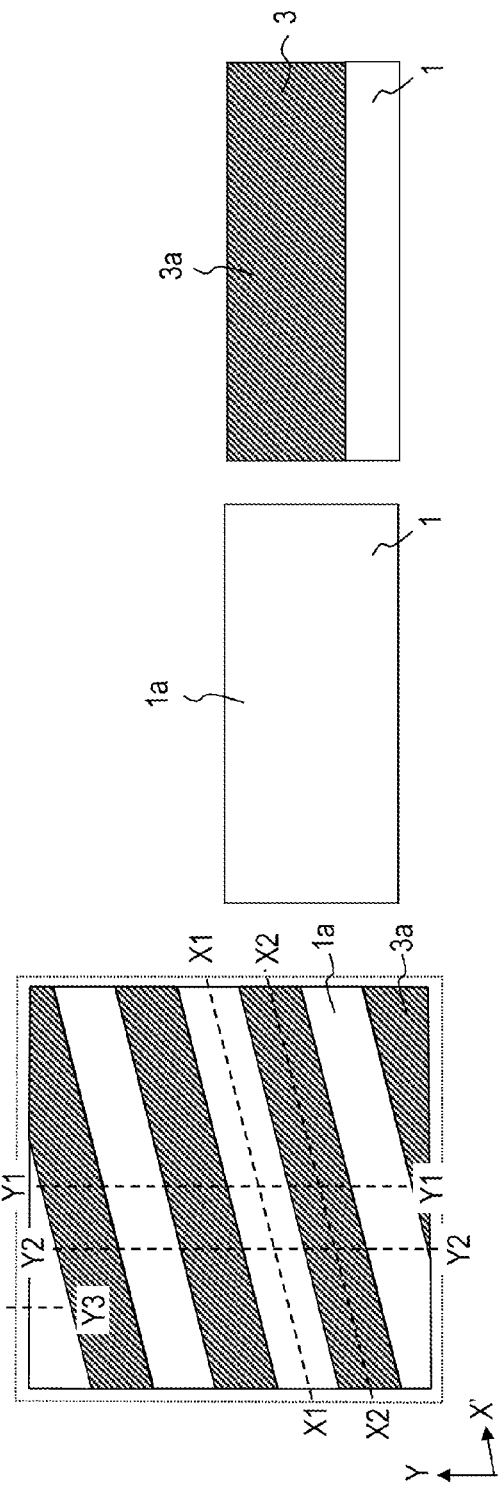
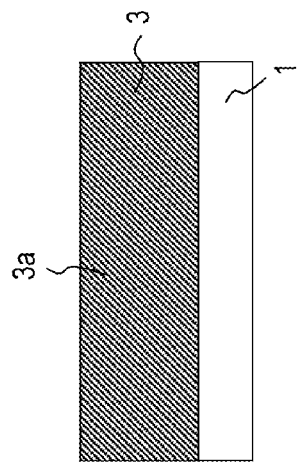
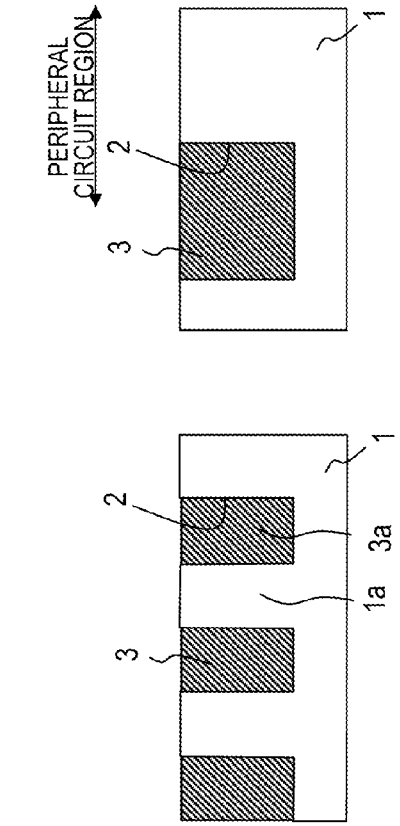

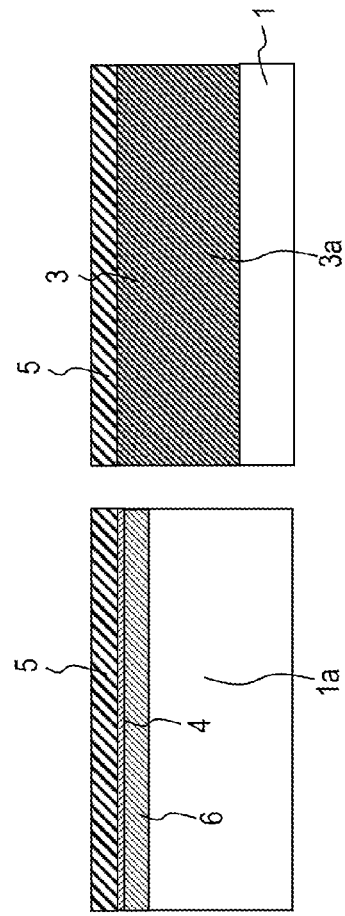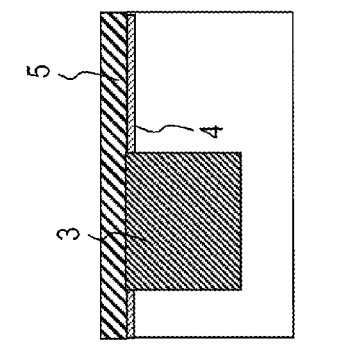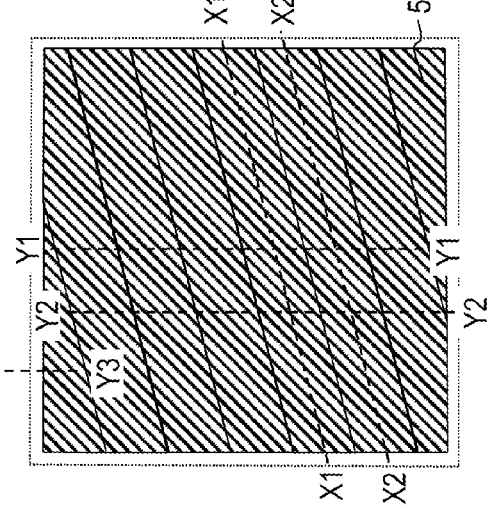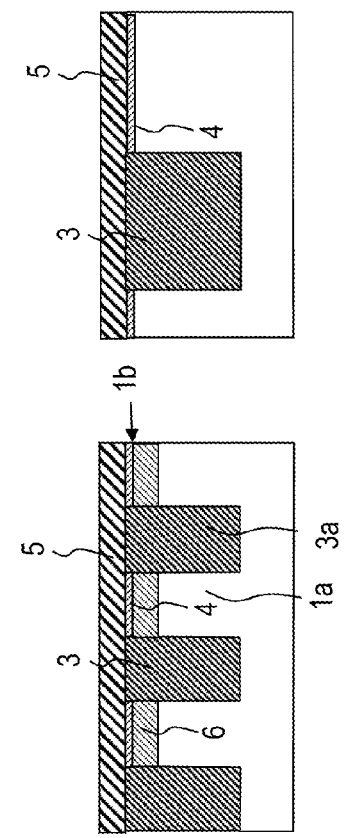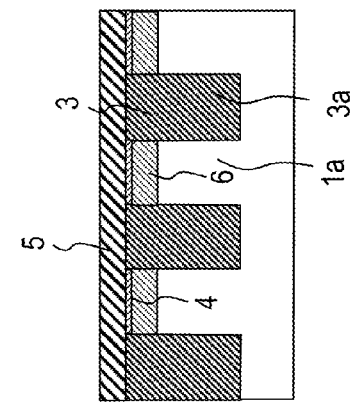

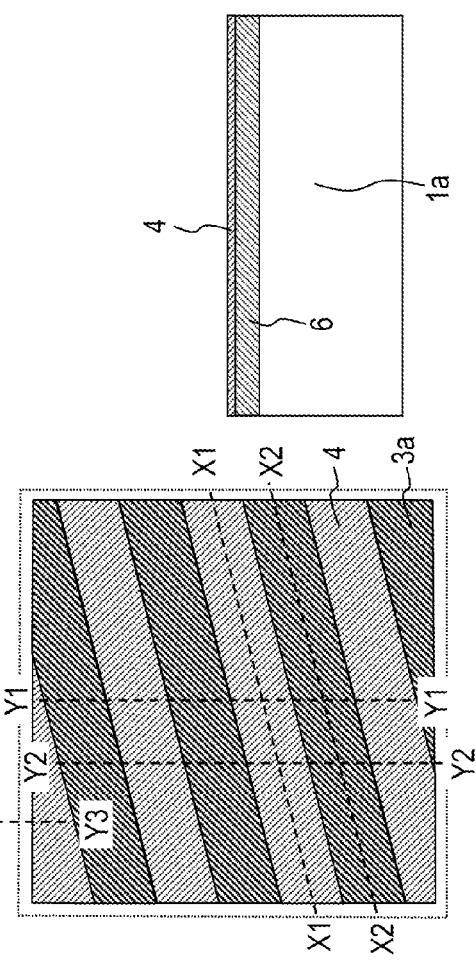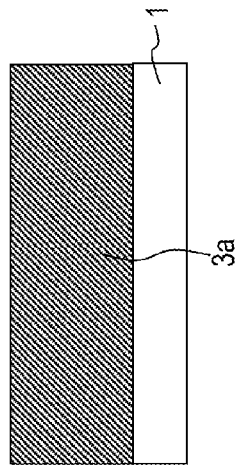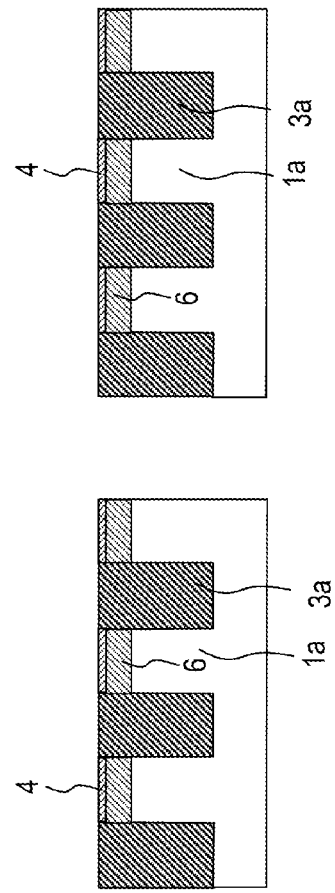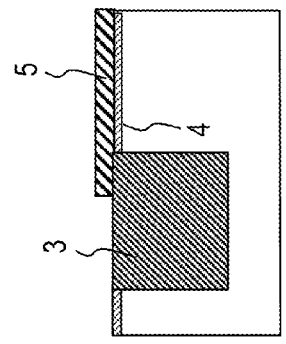

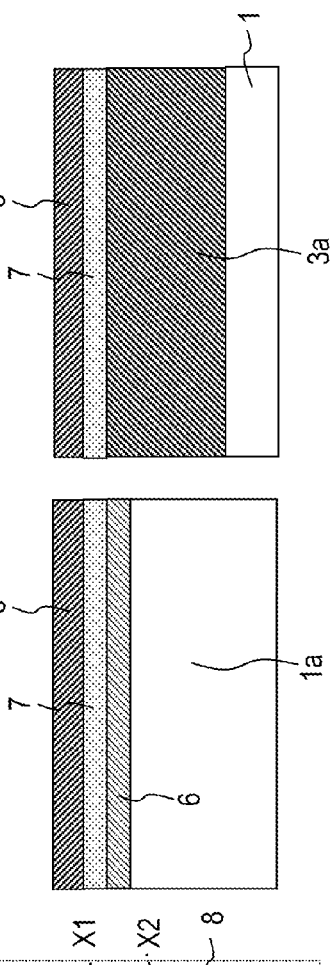
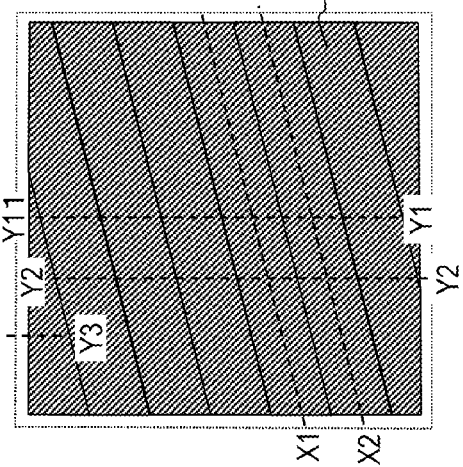
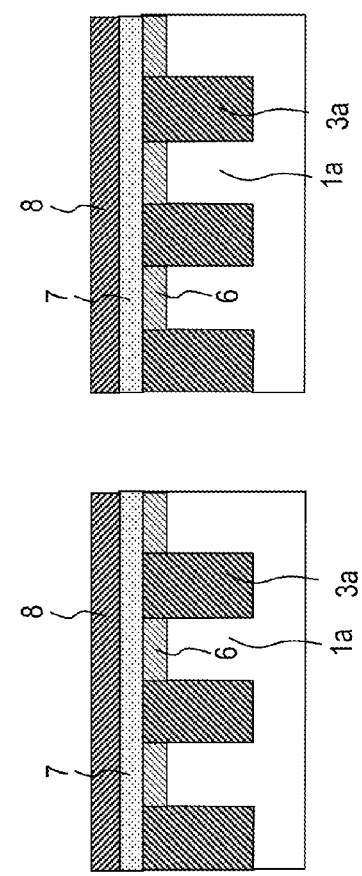
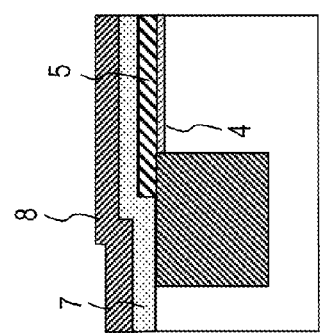
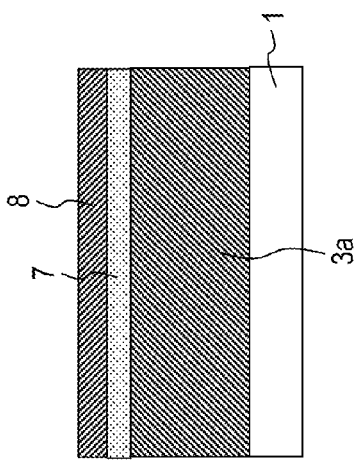

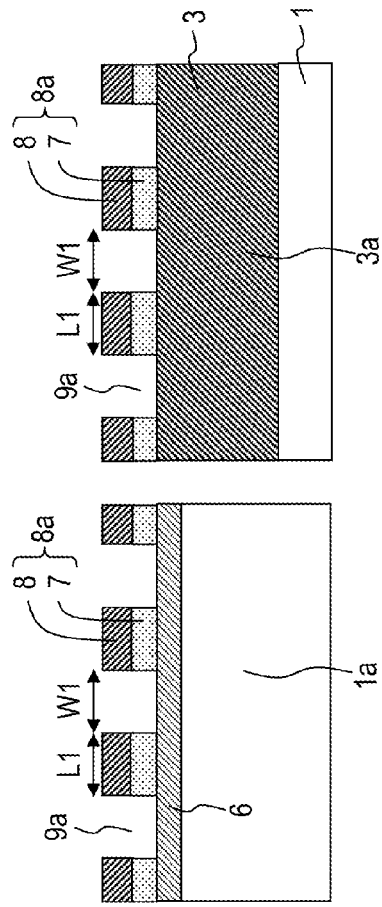
FIG.7A
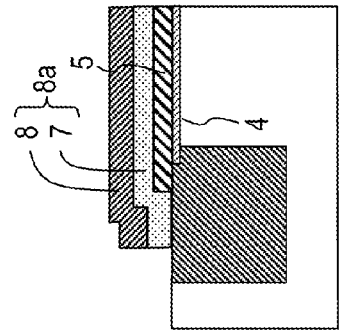
FIG.7B
X1-X1 CROSS SECTION
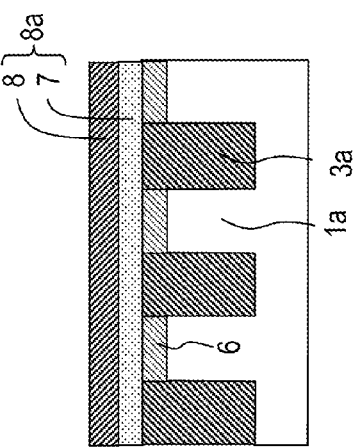
FIG.7C
X2-X2 CROSS SECTION
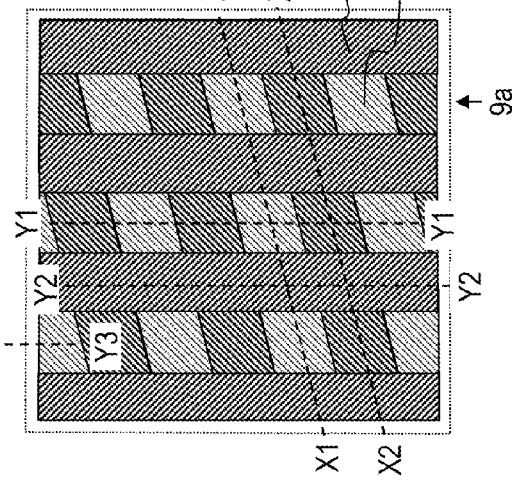
FIG.7D
Y1-Y1 CROSS SECTION
FIG.7E
Y2-Y2 CROSS SECTION
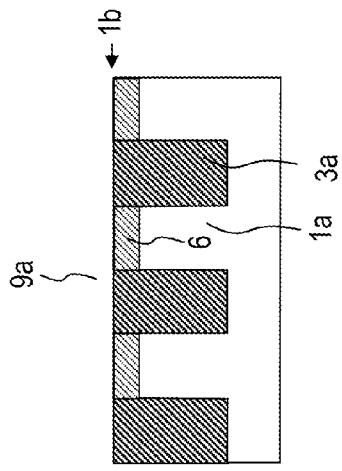
FIG.7F
Y3-Y3 CROSS SECTION
(PERIPHERAL CIRCUIT REGION)

X2-X2 CROSS SECTION

X1-X1 CROSS SECTION

Y3-Y3 CROSS SECTION
(PERIPHERAL CIRCUIT REGION)

Y2-Y2 CROSS SECTION

Y1-Y1 CROSS SECTION

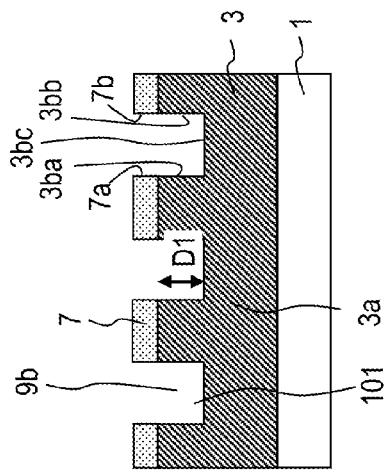
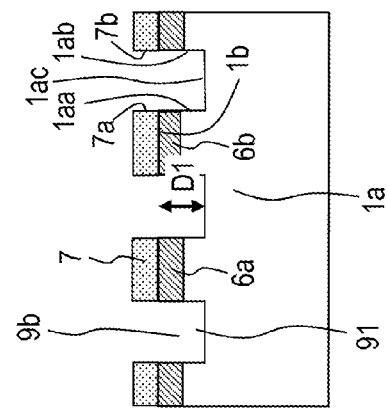
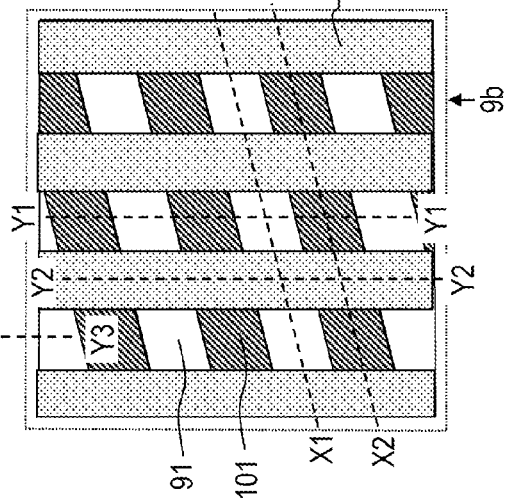
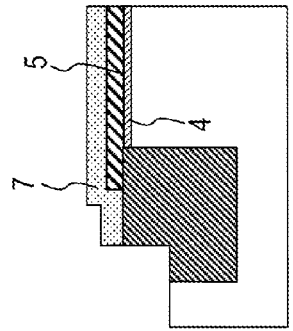
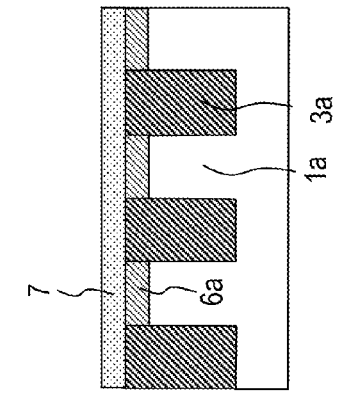
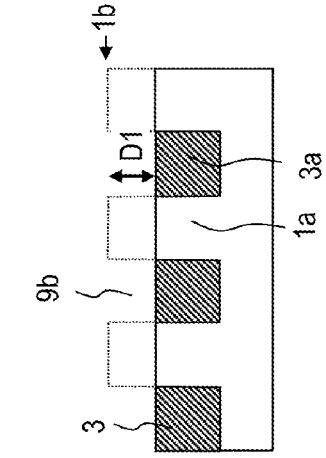

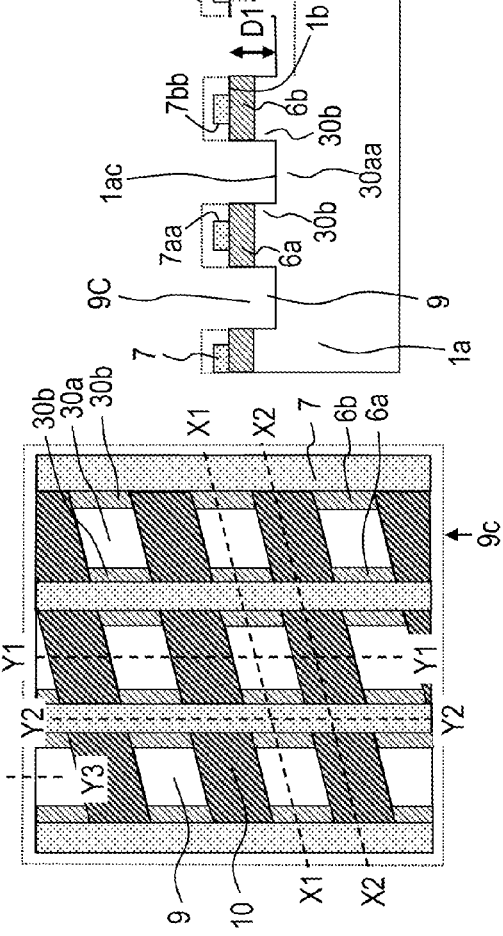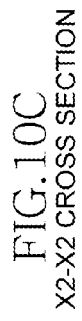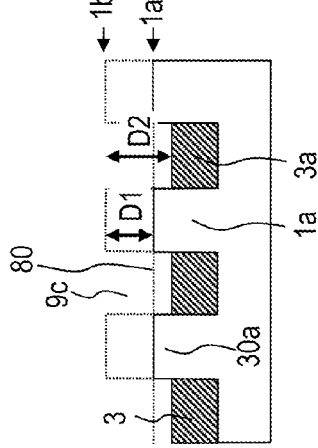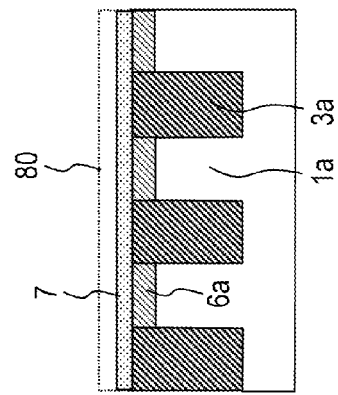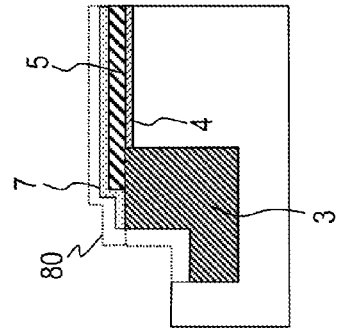

X1-X1 CROSS SECTION

X2-X2 CROSS SECTION

Y1-Y1 CROSS SECTION

Y2-Y2 CROSS SECTION

Y3-Y3 CROSS SECTION
(PERIPHERAL CIRCUIT REGION)

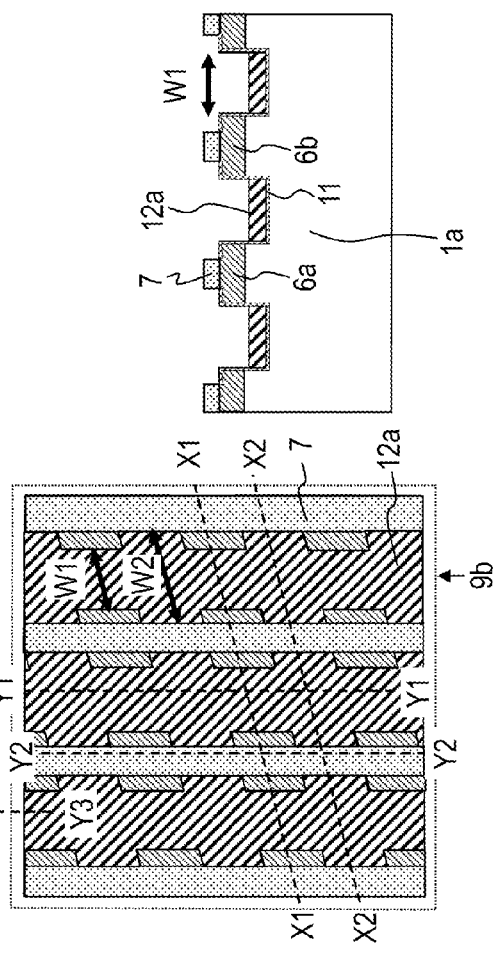
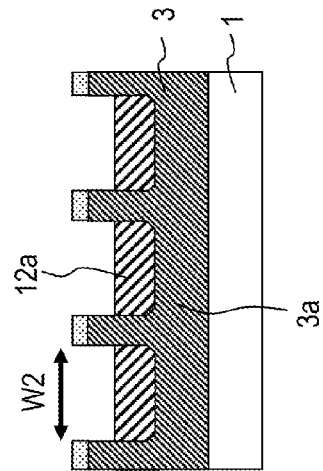
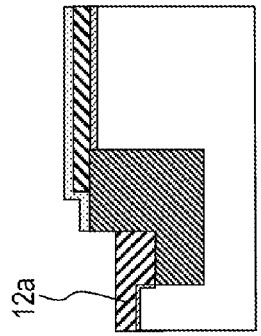
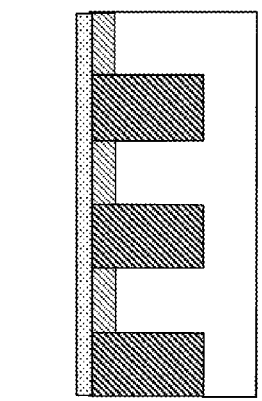
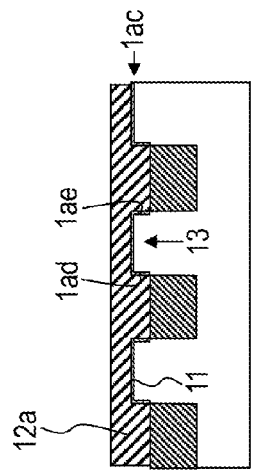

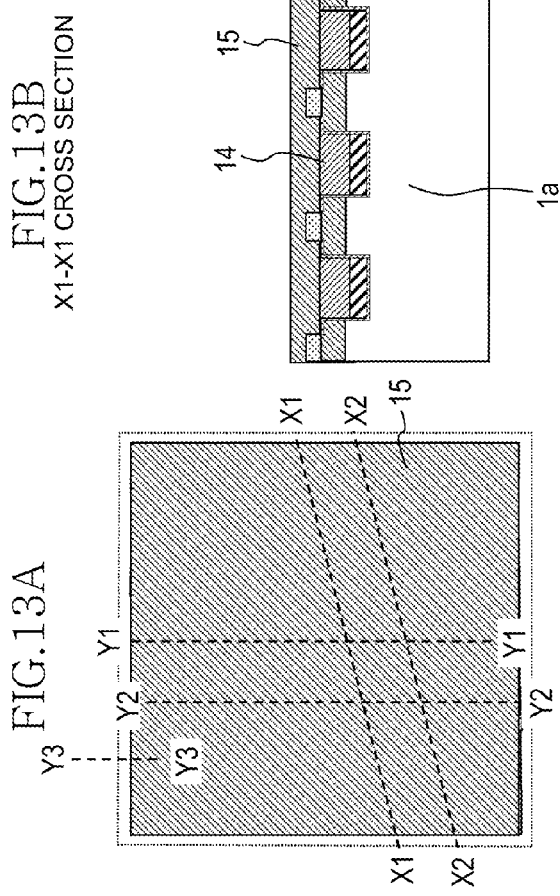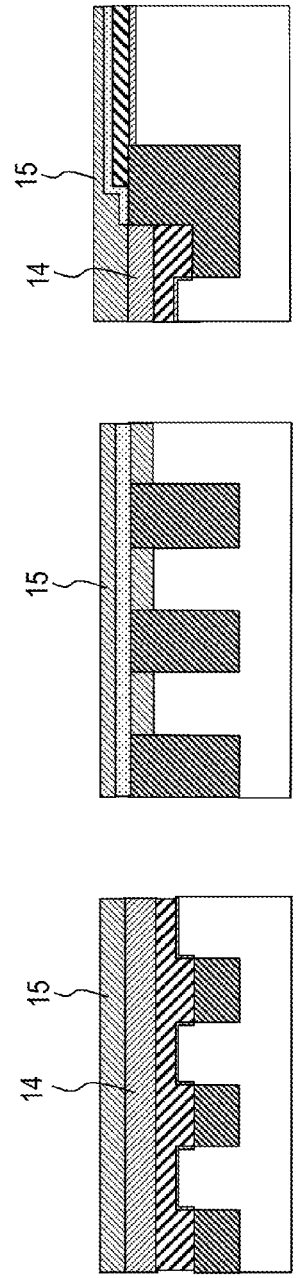

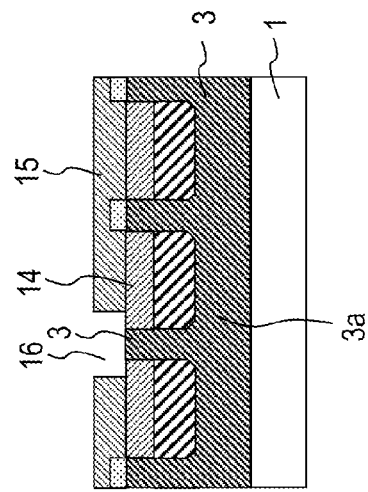
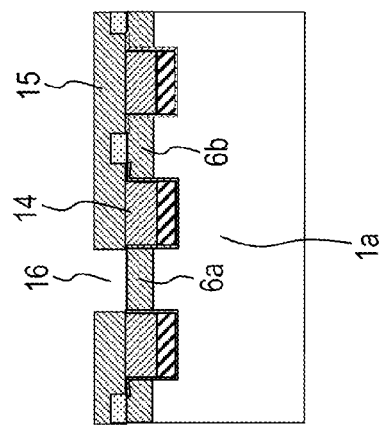
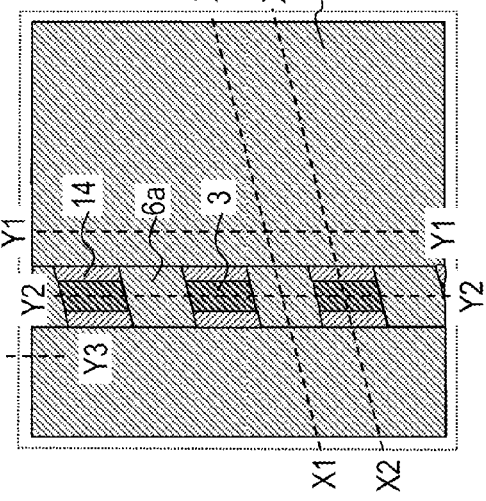
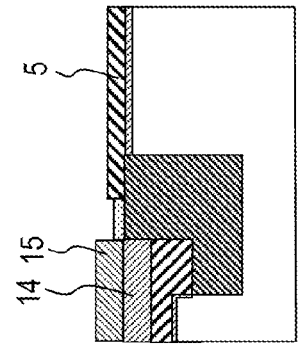
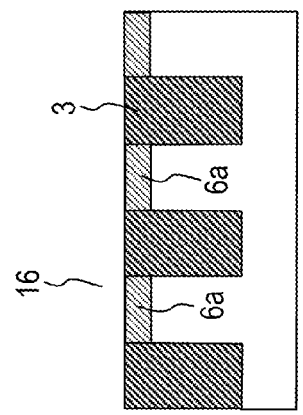
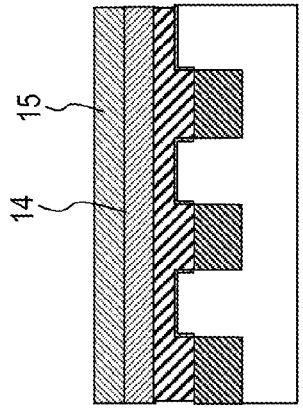

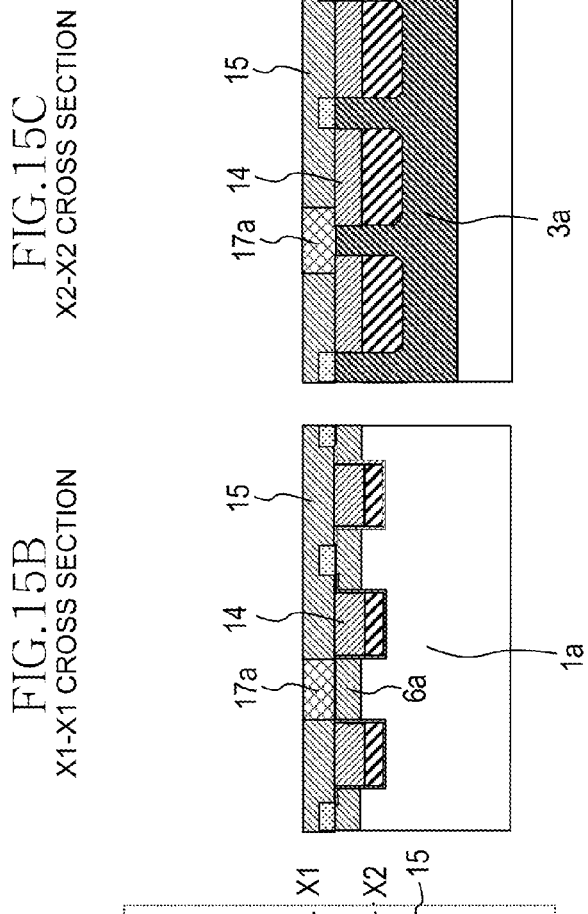
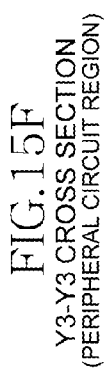
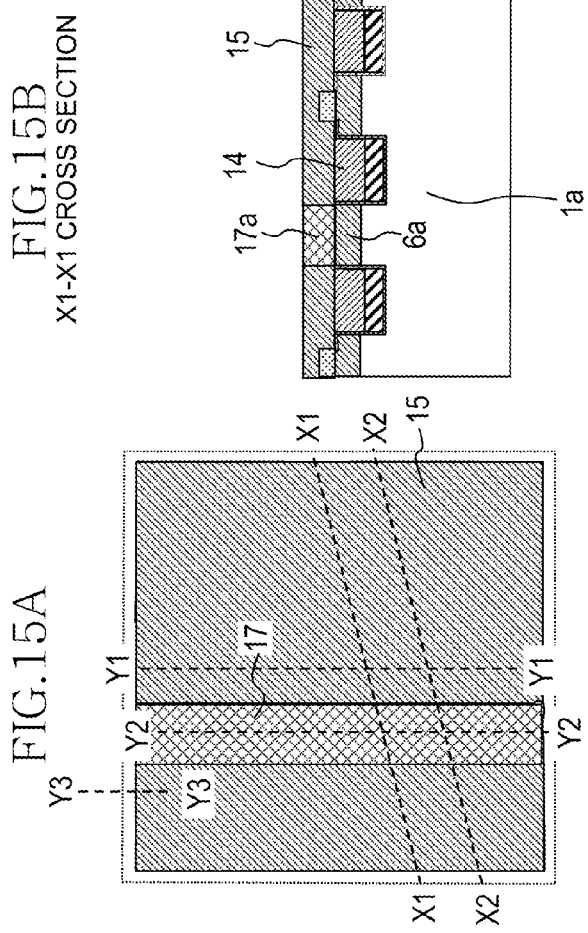
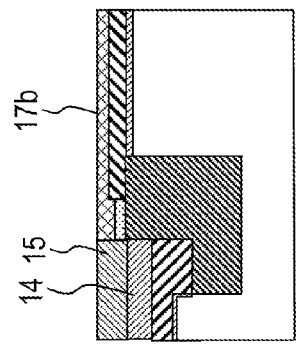
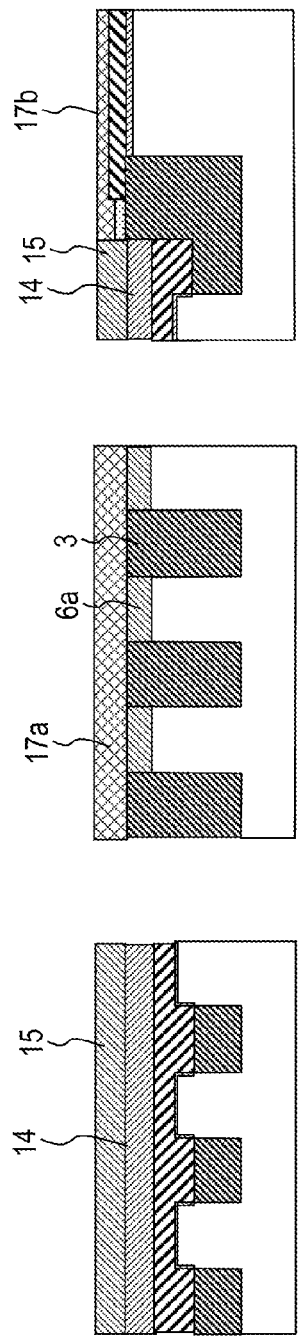

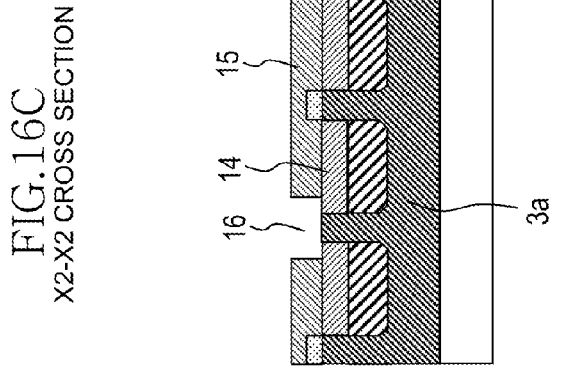
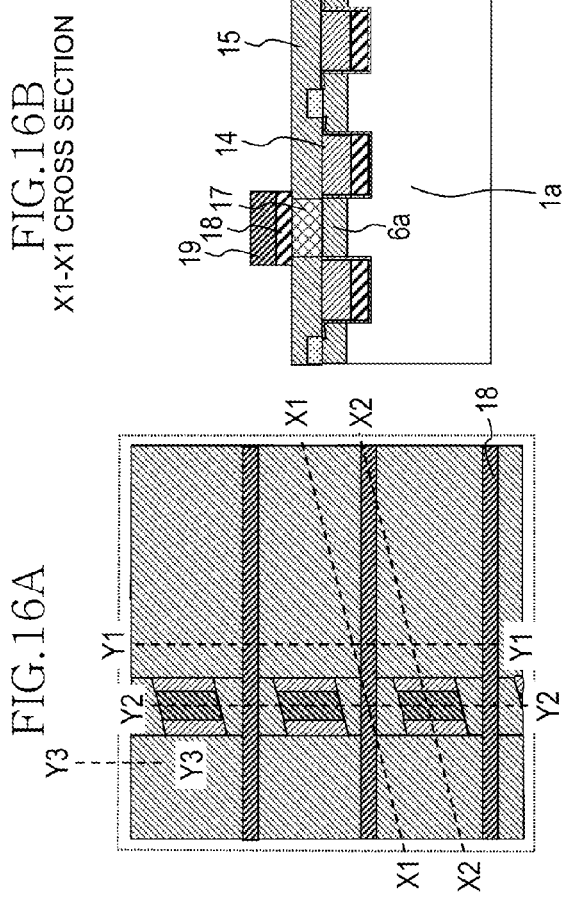
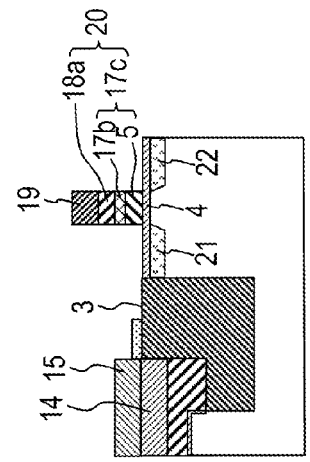
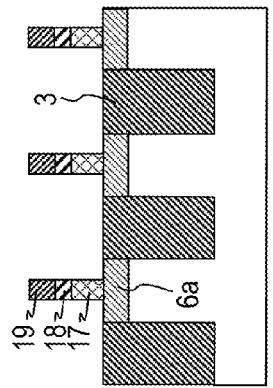
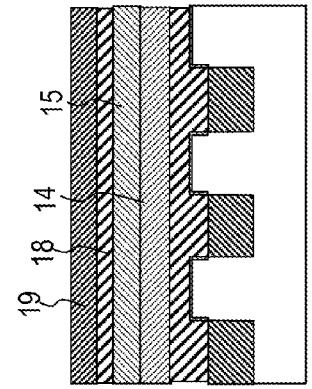

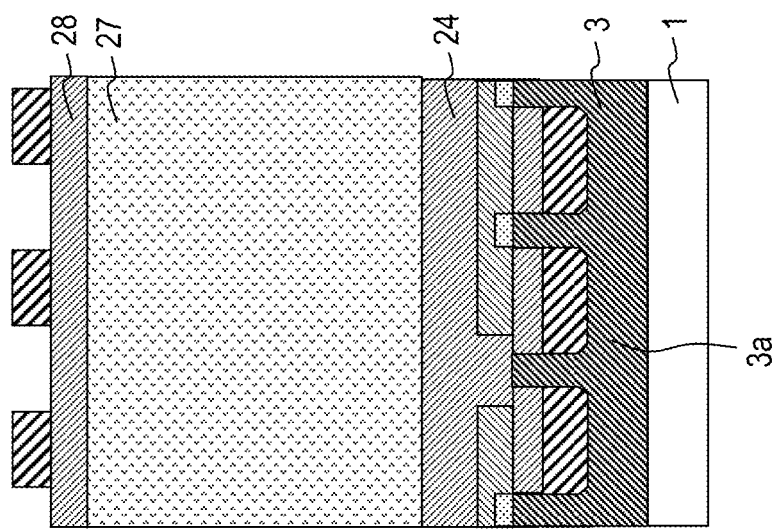
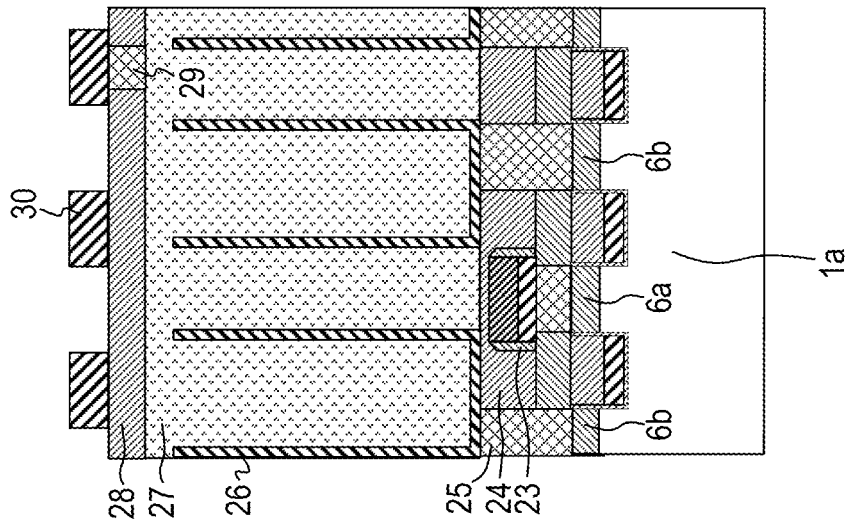
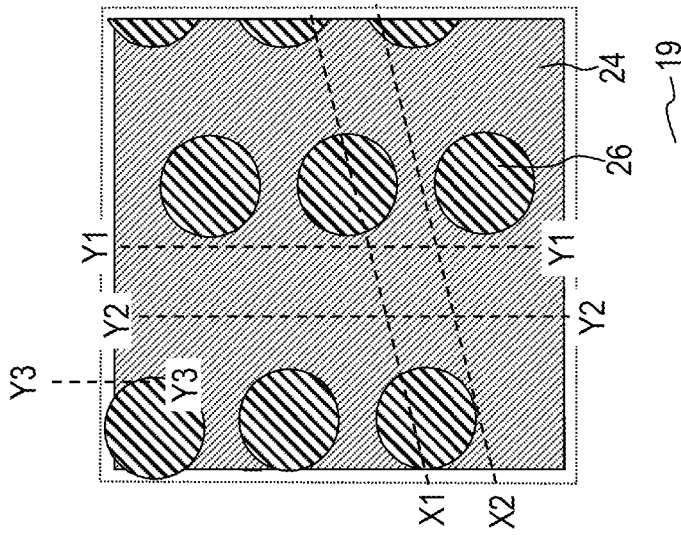

SEMICONDUCTOR DEVICE HAVING GATE TRENCH AND MANUFACTURING METHOD THEREOF

BACKGROUND OF THE INVENTION

1. Field of the Invention

The present invention relates to a semiconductor device and a method of forming a semiconductor device.

2. Description of Related Art

Recently, dimensions of transistors have become smaller due to miniaturization of semiconductor elements. The dimensional reductions of the transistors will cause remarkable short channel effects of the transistors. As the dimensions of memory cells in dynamic random access memories (DRAMs) and the like are reduced, the channel lengths of transistors are also reduced, which may cause degradation of the performance of transistors. The deterioration in retention of memory cells or writing characteristics has been problematic.

In view of the above, recess (trench) field effect transistors (FETs), fin FETs, and the like have been developed. The recess (trench) FET has a structure in which a trench (also called a groove) is formed in a semiconductor substrate to obtain a channel having a three-dimensional structure. Japanese Unexamined Patent Application, First Publications, Nos. JP-A-2005-064500, JP-A-2007-027753, and JP-A-2007-305827 disclose that the fin FET has a structure in which a fin is formed between trenches to obtain a channel having a three-dimensional structure.

The trench FET is formed by forming a trench in a semiconductor substrate and forming a gate electrode within the trench while a gate insulating film is interposed between the gate electrode and the semiconductor substrate. A channel of the trench FET has a three-dimensional structure. The fin FET is formed by forming a gate electrode over a gate insulting film so as to cross over a fin protruding from a bottom surface of the trenches formed in the semiconductor substrate. Consequently, the channel has a three-dimensional structure. In any case, it is possible to suppress the short channel effects because the gate length can be lengthened with respect to the channel width.

A study has been carried out to adopt buried gate transistors for selecting transistors included in memory cells in the DRAMs due to reduction in size of the memory cell. The buried gate transistor has a structure in which a gate electrode is buried in the semiconductor substrate.

The gate electrode of the buried gate transistor does not protrude from the surface of the substrate because the gate electrode (word line) is buried in the semiconductor substrate. Among wirings connected to memory cells, only bit lines are located over the semiconductor substrate. This will increase flexibility of layouts of capacitors, contact plugs, and the like, which are included in the memory cell and formed over the semiconductor substrate. This will reduce the difficulty of processing the capacitors, the contact plugs, and the like.

A transistor as shown in FIG. 18 has the channel of the three-dimensional structure described above. The transistor is formed as follows. An isolation region 101 and an active region 102 are formed in a surface portion of a semiconductor substrate 100. Trench portions 103 and 104 for a buried gate electrode are formed in the isolation region 101 and the active region 102, respectively. A fin portion 107 is a protrusion which is a part of the active region 102 between the trench portions 103. A saddle fin gate electrode 106 is formed by burying a conductive material in the trench portions 103 and 104 while a gate insulating film 105 is interposed between the saddle fin gate electrode 106 and the semiconductor substrate. That is, the saddle fin gate electrode 106 crosses over the fin portion 107. An upper surface 107a of the fin portion 107 is located to be higher than a bottom surface of the trench portion 103 and to be lower than an upper surface of the active region 102 (an upper surface of the semiconductor substrate 100). This is because the trench portion 104 in the active region 102 is shallower than the trench portion 103 formed in the isolation region 102. A source region 108a and a drain region 108b (impurity diffusion layers) are formed, by implanting ions, in two active regions 102 between which the gate electrode 106 is interposed.

However, widths of the trench portions 103 and 104 for the buried gate electrode become narrow due to the reduction in dimensions of the memory cell described above. Thus, widths of channel regions formed in the upper surface 107a and a side surface 107b of the fin portion 107 also become narrow in correspondence with the widths of the buried gate trench portions 103 and 104. Therefore, in some cases, it is difficult to sufficiently secure an ON current due to a short channel effect.

SUMMARY

In one embodiment, there is provided a manufacturing method of a semiconductor device that includes: forming a plurality of element isolation regions extending in a first direction in parallel on a semiconductor substrate so that a plurality of active regions each sandwiched between adjacent two of the element isolation regions are defined in the semiconductor substrate, each of the element isolation regions having an element isolation insulating film filling an isolation trench formed in the semiconductor substrate, and the active regions being arranged at a predetermined pitch in a second direction intersecting with the first direction; forming a plurality of gate trenches extending in the second direction across the element isolation regions and the active regions, each of the gate trenches having a plurality of first trench portions crossing the active regions and a plurality of second trench portions crossing the element isolation regions, the first trench portions having bottom surfaces positioned at higher than bottom surfaces of the second trench portions so that each of the active regions have a plurality of first fin portions formed on the bottom surfaces of the first trench portions protruding with respect to the bottom surfaces of the second trench portions, and the second trench portions having a width in the first direction wider than a width of the first trench portions in the first direction so that each of the active regions have a plurality of second fin portions formed on side surfaces of the first trench portions protruding with respect to the side surfaces of the second trench portions; forming a plurality of conductive films each buries a lower portion of an associated one of the gate trenches; and forming a plurality of cap insulating films each covers an upper surface of an associated one of the conductive films so that the cap insulating films bury upper portions of the gate trenches.

In another embodiment, there is provided a manufacturing method of a semiconductor device that includes: forming first and second element isolation regions extending in a first direction in a semiconductor substrate so that an active region of the semiconductor substrate sandwiched between the first and second element isolation regions in a second direction intersecting with the first direction is defined; forming first and second films extending in the second direction over the first and second element isolation regions and the active region, each of the first and second films having a lower film and an upper film; anisotropic etching the first and second element isolation regions and the active region using the upper films as an etching mask so that a first trench portion is formed in the active region and second trench portions are formed in the first and second element isolation regions; removing the upper films so that the lower films are exposed; and isotropic etching the first and second element isolation regions and the lower films so that a first fin portion is formed on a bottom surface of the first trench portions protruding with respect to bottom surfaces of the second trench portions, and so that second fin portions are formed on side surfaces of the first trench portions protruding with respect to side surfaces of the second trench portions.

BRIEF DESCRIPTION OF THE DRAWINGS

FIGS. 1A to 1C are views indicative of an embodiment of a semiconductor device to which the present invention applies, in which FIG. 1A is a plan view of the semiconductor device 100, FIG. 1B is an enlarged bird's-eye view of a main part of the semiconductor device 100, and FIG. 1C is a cross sectional view indicative of an embodiment of a channel structure;

FIGS. 2A to 2C are graphs indicative of results of comparing between electrical characteristics of the semiconductor device to which the present invention applies and electrical characteristics of the conventional technique, in which FIG. 2A shows a drive current (Ion) characteristics, FIG. 2B shows a threshold voltage characteristics and FIG. 2C shows sub-threshold (SS) characteristics;

FIGS. 3A to 3F are views indicative of an embodiment of one process of a method of manufacturing a semiconductor device to which the present invention applies, in which FIG. 3A is a plan view, FIG. 3B is a cross sectional view taken along an X1-X1 section line of FIG. 3A, FIG. 3C is a cross sectional view taken along an X2-X2 section line of FIG. 3A, FIG. 3D is a cross sectional view taken along a Y1-Y1 section line of FIG. 3A, FIG. 3E is a cross sectional view taken along a Y2-Y2 section line of FIG. 3A, and FIG. 3F is a cross sectional view taken along a Y3-Y3 section line of FIG. 3A;

FIGS. 4A to 4F are views indicative of an embodiment of one process of a method of manufacturing a semiconductor device to which the present invention applies, in which FIG. 4A is a plan view, FIG. 4B is a cross sectional view taken along an X1-X1 section line of FIG. 4A, FIG. 4C is a cross sectional view taken along an X2-X2 section line of FIG. 4A, FIG. 4D is a cross sectional view taken along a Y1-Y1 section line of FIG. 4A, FIG. 4E is a cross sectional view taken along a Y2-Y2 section line of FIG. 4A, and FIG. 4F is a cross sectional view taken along a Y3-Y3 section line of FIG. 4A;

FIGS. 5A to 5F are views indicative of an embodiment of one process of a method of manufacturing a semiconductor device to which the present invention applies, in which FIG. 5A is a plan view, FIG. 5B is a cross sectional view taken along an X1-X1 section line of FIG. 5A, FIG. 5C is a cross sectional view taken along an X2-X2 section line of FIG. 5A, FIG. 5D is a cross sectional view taken along a Y1-Y1 section line of FIG. 5A, FIG. 5E is a cross sectional view taken along a Y2-Y2 section line of FIG. 5A, and FIG. 5F is a cross sectional view taken along a Y3-Y3 section line of FIG. 5A;

FIGS. 6A to 6F are views indicative of an embodiment of one process of a method of manufacturing a semiconductor device to which the present invention applies, in which FIG. 6A is a plan view, FIG. 6B is a cross sectional view taken along an X1-X1 section line of FIG. 6A, FIG. 6C is a cross sectional view taken along an X2-X2 section line of FIG. 6A, FIG. 6D is a cross sectional view taken along a Y1-Y1 section line of FIG. 6A, FIG. 6E is a cross sectional view taken along a Y2-Y2 section line of FIG. 6A, and FIG. 6F is a cross sectional view taken along a Y3-Y3 section line of FIG. 6A;

FIGS. 7A to 7F are views indicative of an embodiment of one process of a method of manufacturing a semiconductor device to which the present invention applies, in which FIG. 7A is a plan view, FIG. 7B is a cross sectional view taken along an X1-X1 section line of FIG. 7A, FIG. 7C is a cross sectional view taken along an X2-X2 section line of FIG. 7A, FIG. 7D is a cross sectional view taken along a Y1-Y1 section line of FIG. 7A, FIG. 7E is a cross sectional view taken along a Y2-Y2 section line of FIG. 7A, and FIG. 7F is a cross sectional view taken along a Y3-Y3 section line of FIG. 7A;

FIGS. 8A to 8F are views indicative of an embodiment of one process of a method of manufacturing a semiconductor device to which the present invention applies, in which FIG. 8A is a plan view, FIG. 8B is a cross sectional view taken along an X1-X1 section line of FIG. 8A, FIG. 8C is a cross sectional view taken along an X2-X2 section line of FIG. 8A, FIG. 8D is a cross sectional view taken along a Y1-Y1 section line of FIG. 8A, FIG. 8E is a cross sectional view taken along a Y2-Y2 section line of FIG. 8A, and FIG. 8F is a cross sectional view taken along a Y3-Y3 section line of FIG. 8A;

FIGS. 9A to 9F are views indicative of an embodiment of one process of a method of manufacturing a semiconductor device to which the present invention applies, in which FIG. 9A is a plan view, FIG. 9B is a cross sectional view taken along an X1-X1 section line of FIG. 9A, FIG. 9C is a cross sectional view taken along an X2-X2 section line of FIG. 9A, FIG. 9D is a cross sectional view taken along a Y1-Y1 section line of FIG. 9A, FIG. 9E is a cross sectional view taken along a Y2-Y2 section line of FIG. 9A, and FIG. 9F is a cross sectional view taken along a Y3-Y3 section line of FIG. 9A;

FIGS. 10A to 10F are views indicative of an embodiment of one process of a method of manufacturing a semiconductor device to which the present invention applies, in which FIG. 10A is a plan view, FIG. 10B is a cross sectional view taken along an X1-X1 section line of FIG. 10A, FIG. 10C is a cross sectional view taken along an X2-X2 section line of FIG. 10A, FIG. 10D is a cross sectional view taken along a Y1-Y1 section line of FIG. 10A, FIG. 10E is a cross sectional view taken along a Y2-Y2 section line of FIG. 10A, and FIG. 10F is a cross sectional view taken along a Y3-Y3 section line of FIG. 10A;

FIGS. 11A to 11F are views indicative of an embodiment of one process of a method of manufacturing a semiconductor device to which the present invention applies, in which FIG. 11A is a plan view, FIG. 11B is a cross sectional view taken along an X1-X1 section line of FIG. 11A, FIG. 11C is a cross sectional view taken along an X2-X2 section line of FIG. 11A, FIG. 11D is a cross sectional view taken along a Y1-Y1 section line of FIG. 11A, FIG. 11E is a cross sectional view taken along a Y2-Y2 section line of FIG. 11A, and FIG. 11F is a cross sectional view taken along a Y3-Y3 section line of FIG. 11A;

FIGS. 12A to 12F are views indicative of an embodiment of one process of a method of manufacturing a semiconductor device to which the present invention applies, in which FIG. 12A is a plan view, FIG. 12B is a cross sectional view taken along an X1-X1 section line of FIG. 12A, FIG. 12C is a cross sectional view taken along an X2-X2 section line of FIG. 12A, FIG. 12D is a cross sectional view taken along a Y1-Y1 section line of FIG. 12A, FIG. 12E is a cross sectional view taken along a Y2-Y2 section line of FIG. 12A, and FIG. 12F is a cross sectional view taken along a Y3-Y3 section line of FIG. 12A;

FIGS. 13A to 13F are views indicative of an embodiment of one process of a method of manufacturing a semiconductor device to which the present invention applies, in which FIG. 13A is a plan view, FIG. 13B is a cross sectional view taken along an X1-X1 section line of FIG. 13A, FIG. 13C is a cross sectional view taken along an X2-X2 section line of FIG. 13A, FIG. 13D is a cross sectional view taken along a Y1-Y1 section line of FIG. 13A, FIG. 13E is a cross sectional view taken along a Y2-Y2 section line of FIG. 13A, and FIG. 13F is a cross sectional view taken along a Y3-Y3 section line of FIG. 13A;

FIGS. 14A to 14F are views indicative of an embodiment of one process of a method of manufacturing a semiconductor device to which the present invention applies, in which FIG. 14A is a plan view, FIG. 14B is a cross sectional view taken along an X1-X1 section line of FIG. 14A, FIG. 14C is a cross sectional view taken along an X2-X2 section line of FIG. 14A, FIG. 14D is a cross sectional view taken along a Y1-Y1 section line of FIG. 14A, FIG. 14E is a cross sectional view taken along a Y2-Y2 section line of FIG. 14A, and FIG. 14F is a cross sectional view taken along a Y3-Y3 section line of FIG. 14A;

FIGS. 15A to 15F are views indicative of an embodiment of one process of a method of manufacturing a semiconductor device to which the present invention applies, in which FIG. 15A is a plan view, FIG. 15B is a cross sectional view taken along an X1-X1 section line of FIG. 15A, FIG. 15C is a cross sectional view taken along an X2-X2 section line of FIG. 15A, FIG. 15D is a cross sectional view taken along a Y1-Y1 section line of FIG. 15A, FIG. 15E is a cross sectional view taken along a Y2-Y2 section line of FIG. 15A, and FIG. 15F is a cross sectional view taken along a Y3-Y3 section line of FIG. 15A;

FIGS. 16A to 16F are views indicative of an embodiment of one process of a method of manufacturing a semiconductor device to which the present invention applies, in which FIG. 16A is a plan view, FIG. 16B is a cross sectional view taken along an X1-X1 section line of FIG. 16A, FIG. 16C is a cross sectional view taken along an X2-X2 section line of FIG. 16A, FIG. 16D is a cross sectional view taken along a Y1-Y1 section line of FIG. 16A, FIG. 16E is a cross sectional view taken along a Y2-Y2 section line of FIG. 16A, and FIG. 16F is a cross sectional view taken along a Y3-Y3 section line of FIG. 16A;

FIGS. 17A to 17C are views indicative of an embodiment of one process of a method of manufacturing a semiconductor device to which the present invention applies, in which FIG. 17A is a plan view, FIG. 17B is a cross sectional view taken along an X1-X1 section line of FIG. 17A, FIG. 17C is a cross sectional view taken along an X2-X2 section line of FIG. 17A.

DETAILED DESCRIPTION OF THE EMBODIMENTS

Figure 1B:
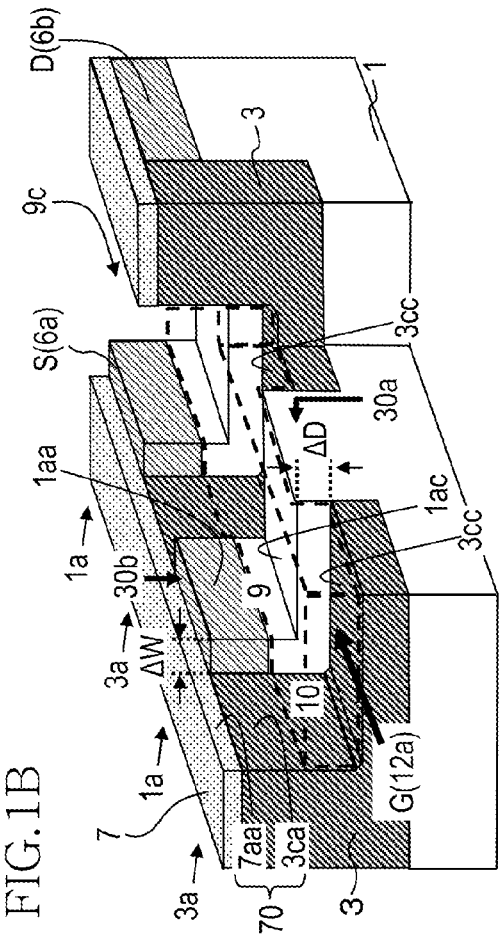

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

(Semiconductor Device)

The structure of a semiconductor device 100 will be described with reference to FIGS. 1A to 1C.

The semiconductor device 100 functions as a DRAM. As shown in FIG. 1A, the semiconductor device 100 includes a cell array region SA and a peripheral circuit region CA in a semiconductor substrate 1. A plurality of memory cells are arranged in a matrix in the cell array region SA. A circuit for controlling operations of each memory cell is disposed in the peripheral circuit region CA. Each of the memory cells arranged in the cell array region SA includes a selection transistor and a capacitor electrically connected to any one of a source and a drain of the selection transistor.

In the cell array region SA, a plurality of isolation regions 3 and a plurality of active regions 1a are alternately arranged in stripes. The plurality of active regions 1a are insulated and isolated by the isolation regions 3a. The plurality of isolation regions 3a are formed as follows. A plurality of isolation trench portions 2 extending in an X' direction (a first direction) are formed in the semiconductor substrate 1. The plurality of isolation regions 3a called shallow trench isolation (STI) are formed by burying isolation insulating films 3 in the plurality of isolation trench portions 2.

In the cell array region SA, a plurality of word lines 12a (first conductors) that extend in the Y direction (the second direction) intersecting with the isolation regions 3a and the active regions 1a are also arranged in the first direction in stripes. The word lines 12a constitute gate electrodes 12a of the selecting transistors. The word lines 12a also constitute so-called buried gate electrodes 12a that are arranged in lower portions of gate electrode trench portions 9c formed across the isolation regions 3a and the active regions 1a, with a gate insulating film 11 interposed between the gate electrodes 12a and the gate electrode trench portions 9c. The buried gate electrodes 12a are constructed from a conductive material (the first conductor) made of metal. In this case, among the gate electrode trench portions 9c extending in the second direction, portions formed to overlap the active regions 1a are referred to as first trench portions 9 and portions formed to overlap the isolation regions 3a are referred to as second trench portions 10. Each of the first trench portions 9 has side surfaces of the semiconductor substrate 1 that constitutes the active regions 1a facing with each other. As shown in FIG. 1A, a width W2 in the first direction of the second trench portions 10 located in the isolation regions 3a is larger than a width W1 in the first direction of the first trench portions 9 located in the active regions 1a. Therefore, the trench portions 9c for the buried gate electrodes including the first trench portions 9 and the second trench portions 10 alternately and repeatedly arranged and extending in the Y direction (the second direction) have a double-edged saw configuration in a planar view. Accordingly, the buried gate electrodes 12a buried in the lower portions of the trench portions 9c also have a double-edged saw configuration in a planar view. Furthermore, a cap insulating film (explained later) that covers upper surfaces of the buried gate electrodes 12a to bridge the trench portions 9c also has a configuration including a double-edged saw shape in a planar view.

Turning to FIG. 1B, specifically, in the cell array region SA, first fin portions 30a, which are portions of the active regions 1a protruding from between bottom surfaces 3cc of adjacent ones of the second trench portions 10, are provided by setting a position in a depth direction of the bottom surfaces 3cc of the second trench portions 10 formed in the isolation regions 3a among the gate electrode trench portions 9c to be deeper than a position in the depth direction of bottom surfaces 1ac of the first trench portions 9 formed in the active regions 1a, and pairs of second fin portions 30b, which are portions of the active regions 1a protruding from between entire side surfaces 70 of adjacent ones of the second trench portions 10 to be continuous with the first fin portions 30a, are provided by setting a position in the first direction of the entire side surfaces 70 of the second trench portions 10 back from a position of entire side surfaces 1aa of the first trench portions 9. Each of the second fin portions 30b is configured to be connected to either end in the first direction of the first fin portion 30a extending in the first direction and to extend in a direction perpendicular to an upper surface of the first fin portion 30a. The entire side surface 70 of the second trench portion 10 indicates a side surface including a side surface 3ca of an element isolation insulating film 3 that constitutes the isolation regions 3a and a side surface 7aa of a mask insulating film 7 provided across upper surfaces of the isolation regions 3a and the active regions 1a. The side surface 3ca of the element isolation insulating film 3 and the side surface 7aa of the mask insulating film 7 are configured to be flush. The upper surface of the element isolation insulating film 3 and the upper surfaces of the active regions 1a are configured to be flush. In the present embodiment, the mask insulating film 7 is preferably made of a material having the same etching rate as that of the element isolation insulating film 3. Preferably, these films are made of the same material to obtain the same etching rate. For example, when the element isolation insulating film is made of a silicon dioxide film, the mask insulating film is also made of the silicon dioxide film. When the element isolation insulating film is made of a silicon nitride film, the mask insulating film is also preferably made of the silicon nitride film. However, the present invention is not limited thereto. It suffices that the element isolation insulating film and the mask insulating film has the same etching rate and these films do not need to be made of the same material.

Figure 1C:
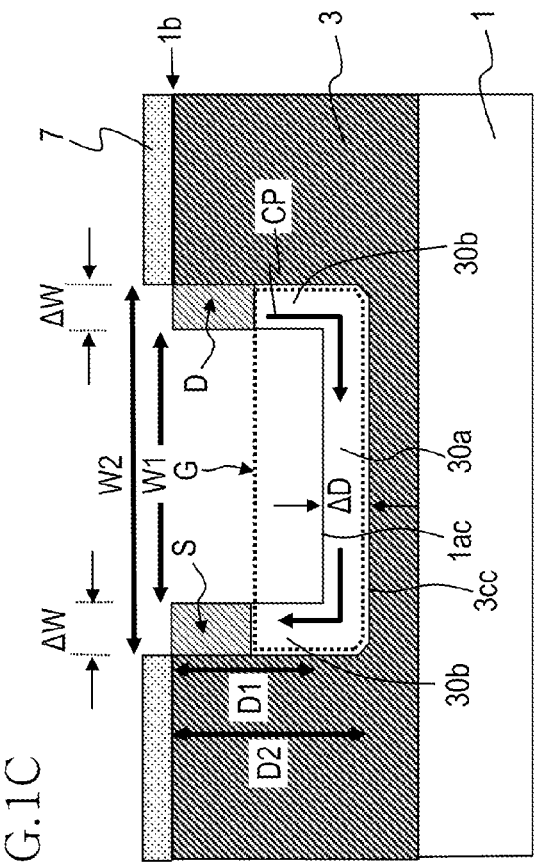

Turning to FIG. 1C, the first fin portion 30a constitutes a first channel region 30a with the width W1 in the first direction, which is formed by causing the bottom surface 1ac of the first trench portion 9 to protrude from between the bottom surfaces 3cc of adjacent ones of the second trench portions 10 by a difference $\Delta D$ (=D2−D1) between a depth D1 of the bottom surface 1ac of the first trench portion 9 from the upper surface 1b of the active region 1a and a depth D2 of the bottom surface 3cc of the second trench portion 10 from the upper surface 1b of the active region 1a.

A pair of the second fin portions 30b is formed by protruding entire side surfaces of the first trench portion 9 adjacent to the second fin portions 30b in the second direction from between entire side surfaces 70 by half ($\Delta W$) a difference $2\Delta W$ (=W2−W1) between the width W1 of the first trench portion 9 and the width W2 of the second trench portion 10 in the first direction. Thereby, second channel regions which extend in a direction perpendicular to the upper surface 1b of the active region 1a from both ends of the first fin portion 30a in the first direction are formed. Width of the second channel regions in the first direction is $\Delta D$.

Figure 1A:
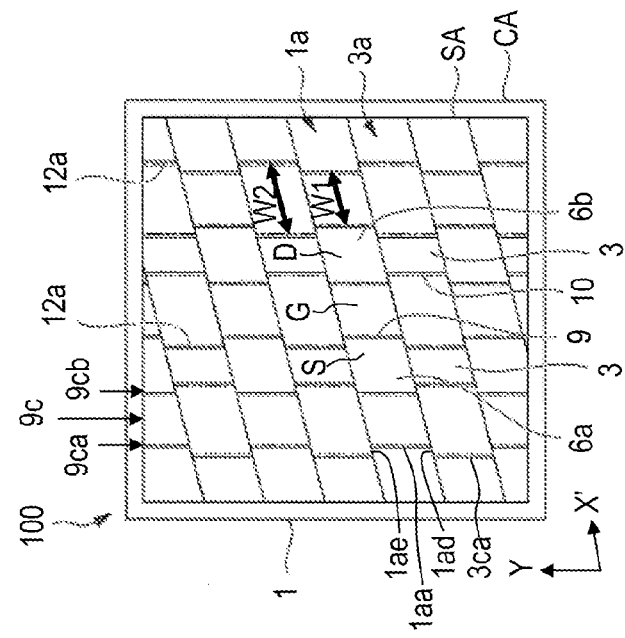

As shown in FIG. 1A, one side surface 9ca extending in the second direction of the gate electrode trench portion 9c extending in the second direction has a side surface obtained by continuously and repeatedly arranging in the second direction a basic side surface, which is a continuous side surface consisting of the side surface 3ca of the second trench portion 10 extending in the second direction, one side surface 1ad of the second fin portion 30b connected to one end of the side surface 3ca and extending in the first direction, the side surface 1aa of the first trench portion 9 connected to an end of the side surface 1ad on a side opposite to an end connected to the side surface 3ca and extending in the second direction, and the other side surface 1ae of the second fin portion 30b connected to an end of the side surface 1aa on a side opposite to an end connected to the side surface 1ad and extending in the first direction. The other side surface 9cb opposite to the side surface 9ca has a similar configuration.

The semiconductor device 100 may include the gate insulating film 11 covering the surfaces of the first and second fin portions 30a and 30b. The gate electrode 12a is buried in gate electrode trench portion 9c so as to cross over the first fin portion 30a and a part of the second fin portion 30b. Therefore, the semiconductor device 100 has a saddle fin channel structure on not only the bottom surface but also the side surface . . .

In parts of the active regions 1a between which the gate electrode 12a is interposed, the drain region 6a and the source region 6b (impurity diffusion layers) are respectively provided by implanting ions. The drain region 6a and the source region 6b function as a source and a drain of the selection transistor, respectively. The drain region 6a and the source region 6b have bottoms which are connected to the tops of the second fin portions 30b, which are located under the drain region 13a and the source region 13b, respectively. The upper surface of the gate electrode 12a mentioned above is provided at position not to overlap with the side surfaces of the source region 6a and the drain region 6b in a horizontal direction parallel to the upper surface 1b of the semiconductor substrate 1.

The gate electrode 12a is buried in the first and second trench portions 9 and 10 extending in the second direction. The gate electrode 12a is interposed between the drain region 6a and the source region 6b. The drain region 6a and the source region 6b respectively have upper surfaces in positions that are higher in level than the upper surface of the gate electrode 12a. The pair of second fin portions (the second channel regions) 30b is continuously connected to the respective bottom surfaces of the drain region 6a and the source region 6b. The pair of second fin portions (the second channel regions) 30b extends substantially in the depth direction that is vertical to the upper surface 1b of the semiconductor substrate 1 from the respective bottom surfaces of the drain region 6a and the source region 6b. One of the pair of second fin portions 30b has first and second side surfaces opposed to each other and a third side surface adjacent to the first and second side surfaces. The other of the pair of second fin portions 30b has fourth and fifth side surfaces opposed to each other and a sixth side surface adjacent to the fourth and fifth side surfaces. The third and sixth side surfaces face toward each other. The distance between the third and sixth surfaces is smaller than the width of a lower portion of the second trench portion 10. The first fin portion 30a is connected to lower portions of the pair of second fin portions 30b. The first fin portion 30a extends in the first direction between the pair of second fin portions 30b. The gate insulating film 11 covers the surfaces of the first and second fin portions 12a and 12b. The gate insulating film 11 covers the first through sixth side surfaces. The gate electrode 12a contacts the gate insulating film 11. The gate electrode 12a faces toward the first through sixth side surfaces while the gate insulating film 11 being interposed between the gate electrode and the first through sixth side surfaces. The semiconductor device 100 has a buried gate transistor.

In the semiconductor device 100 having the above-described structure, electric charges released from the drain region 6b propagate through one second fin portion 30b, the first fin portion 30a, and the other second fin portion 30b and then enter into the source region 6a.

In the semiconductor device 100 according to the present embodiment is applied as described above, the pair of second fin portions (the second channel regions) 30b are provided to extend substantially in the direction vertical to the upper surface 1b of the semiconductor substrate 1 from both ends of the first fin portion (the first channel region) 30a. Therefore, all the channel regions can be configured by the saddle fin channel structure.

Thus, it is possible to increase the ON current $I_{on}$ by reducing the resistance of the entire channel compared to the conventional technique in which only the bottom portion has the saddle fin channel structure.

Figure 2A:
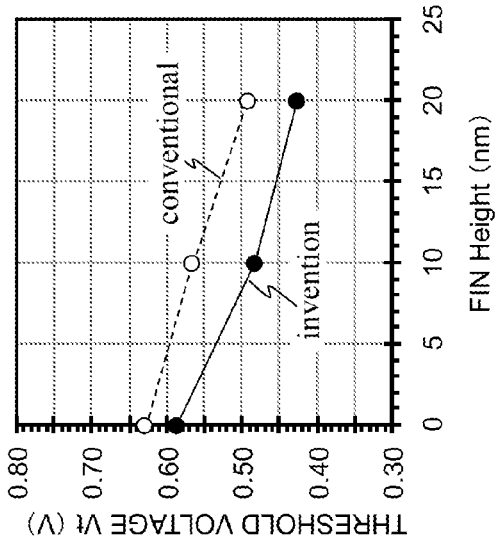
Figure 2B:
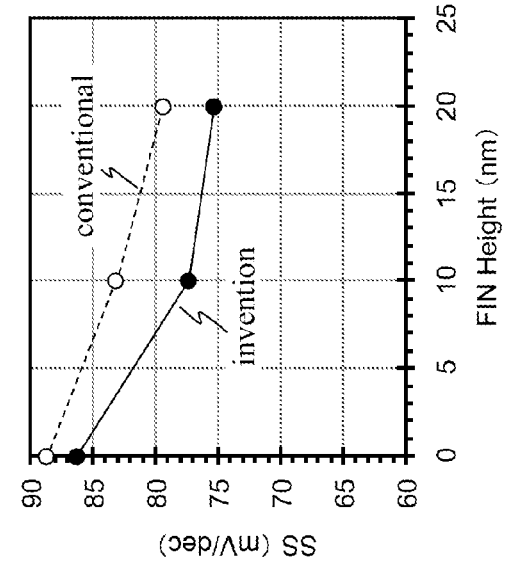
Figure 2C:
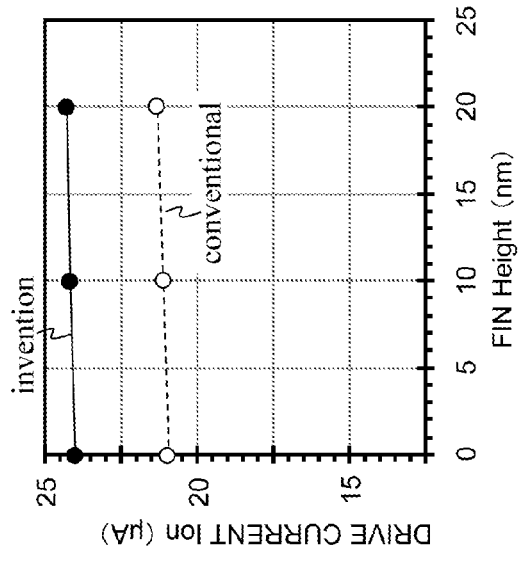
Figure 8C:
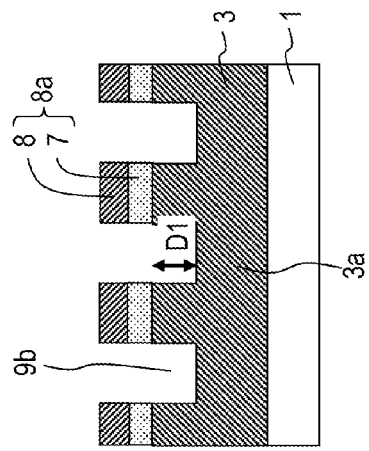
Figure 8B:
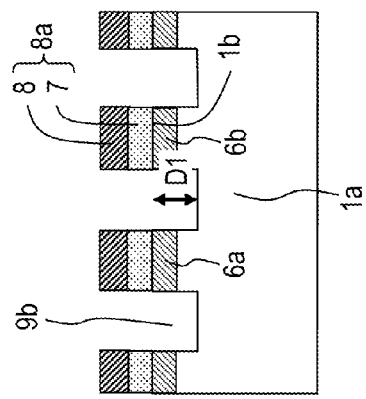
Figure 8F:
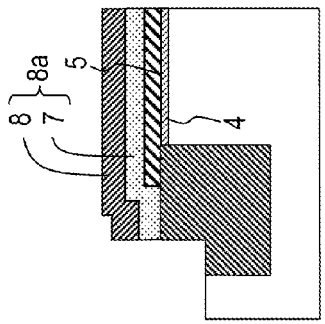
Figure 8E:
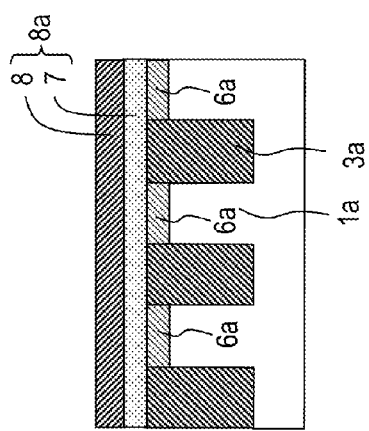
Figure 8A:
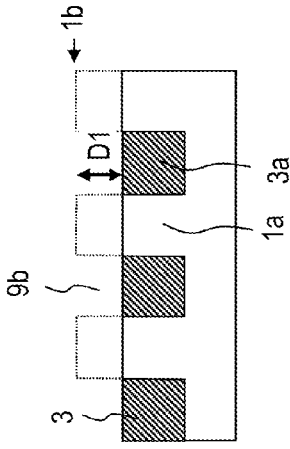
Figure 8D:
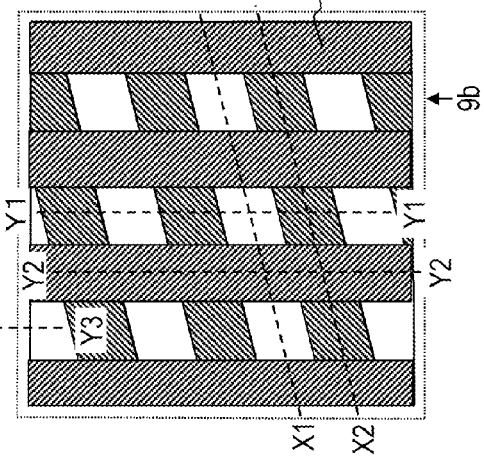
Figure 11B:
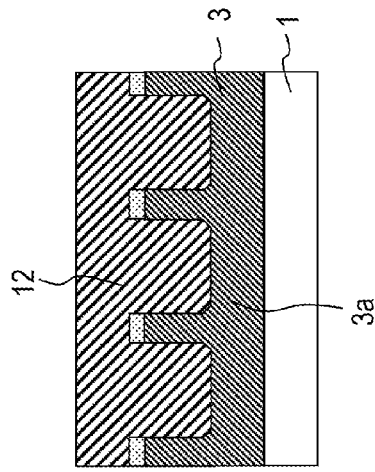
Figure 11C:
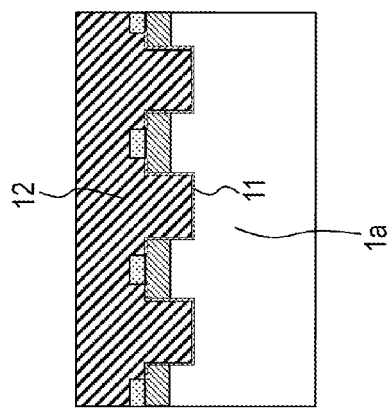
Figure 11A:
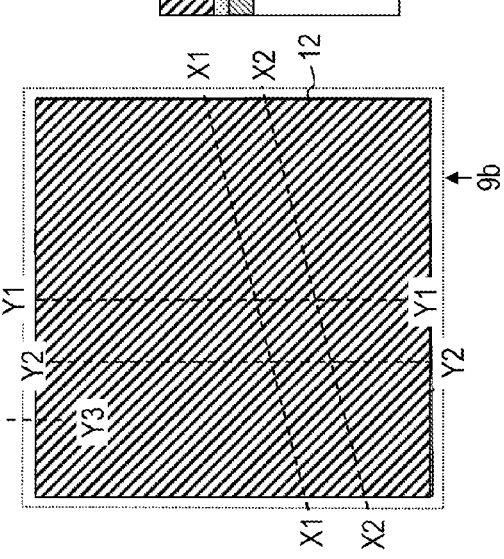
Figure 11D:
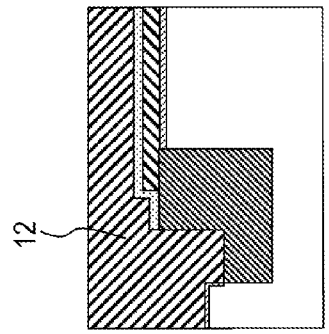
Figure 11E:
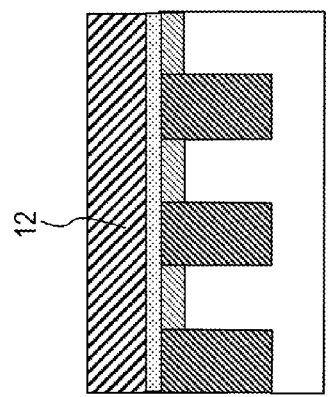
Figure 11F:
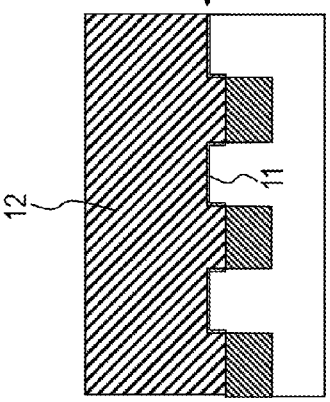
Figure 18:
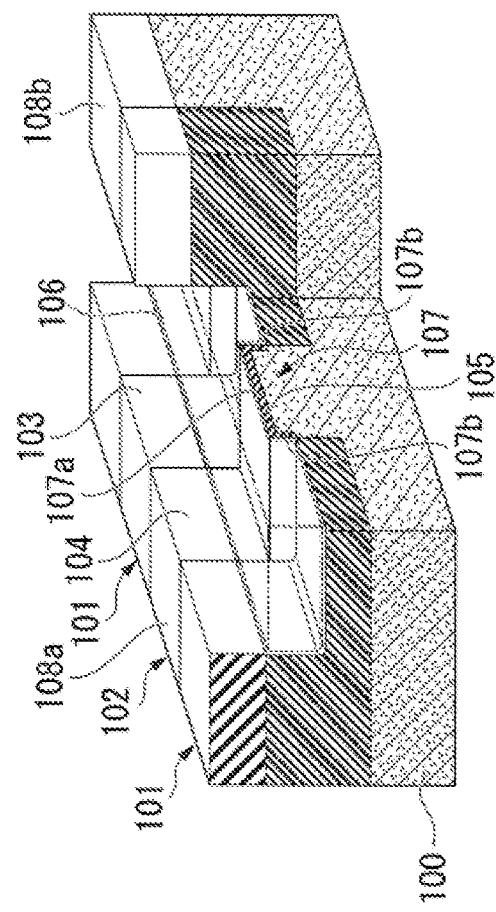
FIG. 18 is a bird's-eye view of an example of a semiconductor device according to the conventional technique.

FIGS. 2A to 2C show results of comparison of electrical characteristics between the buried gate transistor using a saddle fin structure only at the bottom surfaces of the trench portions according to the conventional technique as shown in FIG. 18 and the buried gate transistor according to the present invention in which an entire channel region on the bottom and side surfaces of the trench portions forms a saddle fin structure. The abscissa axes represent the height of a bottom fin portion, mentioned above and denoted by ΔD. As the present invention, results of a transistor having a side fin portion with ΔW (=ΔD) in addition to the bottom fin portion are shown. FIG. 2A shows the magnitude of a drive current Ion, in which a larger value indicates better characteristics. While the drive current has a range of 21 to 21.5 μA in the conventional technique, the transistor of the present invention has a higher range of 24 to 24.5 μA, indicating improvement by about 20%. FIG. 2B shows the magnitude of a threshold voltage and FIG. 2C shows subthreshold (SS) characteristics, in both of which a smaller value indicates better characteristics. It is indicated that the threshold voltage is reduced by about 15% and the SS characteristics are reduced by about 10% when compared on a condition that the height of the fin portion is 10 nm. The transistor of the present invention can contribute to a high speed operation and a low-power consumption operation of a semiconductor device because of effects mentioned above.

In the cell array region SA shown in FIG. 1A described above, a number of the isolation regions 3a and the active regions 1a as described above may be arranged and formed. For the sake of simplicity, FIG. 1A schematically shows that some isolation regions 3a and some active regions 1a are arranged and formed in the cell array region SA.

In the semiconductor device 100, although not shown, two buried word lines 12a operating for a normal transistor and a dummy word line are disposed next to the buried word lines 12a. The dummy word line is a buried wiring for isolation (a dummy gate). A predetermined potential is applied to the dummy word line, so that adjacent transistors on the same active region are isolated. Alternatively, the parasitic transistor is in an OFF state and isolated by applying the predetermined potential to the dummy word line. The dummy word wiring is formed as follows. The trench portions having the same configuration as the word lines 12a are simultaneously formed. A conductive material is buried in the trench portions.

(Method of Manufacturing a Semiconductor Device)

A method of manufacturing the semiconductor device 100 will be described with reference to FIGS. 3A to 17C. In FIGS. 3A, 4A, 5A, 6A, 7A, 8A, 9A, 10A, 11A, 12A, 13A, 14A, 15A, 16A, and 17A, X1-X1 section line, X2-X2 section line, Y1-Y1 section line, Y2-Y2 section line, and Y3-Y3 section line show a cross section of an active region 1a that extends in the first direction, a cross section of an isolation region 3a that extends in the first direction, a cross section of a buried gate electrode that extends in the second direction, a cross section of source/drain diffusion layers that are formed in the second direction, and a cross section of a boundary region crossing over a cell array region SA and a peripheral circuit region CA, respectively.

In the cell array region SA shown in FIGS. 3A, 4A, 5A, 6A, 7A, 8A, 9A, 10A, 11A, 12A, 13A, 14A, 15A, 16A, and 17A, the isolation regions 3a and the active regions 1a as described above are arranged and formed in plural. However, a state in which some isolation regions 3a and some active regions 1a arranged and formed in the cell array region SA are enlarged is schematically shown for convenience in FIGS. 3A, 4A, 5A, 6A, 7A, 8A, 9A, 10A, 11A, 12A, 13A, 14A, 15A, 16A, and 17A.

Referring now to FIGS. 3A to 3F, a semiconductor substrate 1 is prepared before processing. The semiconductor substrate 1 may be, but is not limited to, a single crystal substrate containing a predetermined concentration of p-type impurities, for example, a silicon single crystal substrate containing impurities.

The isolation regions 3a extending in the first direction and the active regions 1a sandwiched by the isolation regions 3a are first formed on a surface of the semiconductor substrate 1 using a known STI method. More specifically, a silicon nitride film (not shown) and a mask film on the silicon nitride film are formed. A mask pattern to open the isolation regions 3a is then formed on the mask film by lithography and an anisotropic dry etching method. The mask pattern is then transferred to the silicon nitride film by the anisotropic dry etching method using the mask film as a mask, thereby exposing the surface of the semiconductor substrate 1 in the isolation regions 3a. The mask film is then removed to expose the silicon nitride film. The semiconductor substrate 1 is then subject to anisotropic dry etching using the exposed silicon nitride film as a mask, thereby forming element isolation trenches 2, which are 280-nm deep, for example. The element isolation insulating film 3 is then formed all over to fill the element isolation trenches 2. A silicon dioxide film or a silicon nitride film is used for the element isolation insulating film 3. In this case, the silicon dioxide film is used therefor. A silicon film that is formed by a flowable CVD method or a spin coating method and then modified by heat treatment in an oxidizing atmosphere can be used as the silicon dioxide film. An HDP (High Density Plasma)-CVD method can be alternatively used. When the silicon nitride film is used, the film can be formed by using an ALD (Atomic Layer Deposition) method. Because the isolation regions 3a formed in the peripheral circuit region have larger areas than those in the memory cell area, a method that enables to first form the element isolation insulating film in the memory cell area and then laminate the silicon dioxide film by the HDP-CVD method to fill the wider isolation regions in the peripheral circuit region is used.

After the element isolation insulating film 3 is formed all over, the element isolation insulating film 3 is etched back by using a CMP (Chemical Mechanical Polishing) method or a dry etching method, and further the silicon nitride film used as the mask is removed using a hot phosphoric acid, thereby forming the isolation regions 3a with the element isolation insulating film 3 filled in the element isolation trenches 2. In this way, the isolation regions 3a extending in the X' direction (the first direction) and the active regions 1a sandwiched by the isolation regions 3a are formed alternately at a regular pitch distance in the Y direction (the second direction) in the cell array region SA, as shown in FIG. 3A. In this case, widths in the Y direction of the isolation regions 3a and the active regions 1a are 30 nm.

Turning to FIGS. 4A to 4F, a first gate insulating film 4 composed of a silicon dioxide film of 3-nm thick is formed on the surface of the semiconductor substrate 1 (the surfaces of the active regions 1a) exposed through the element isolation insulating film 3 by a thermal oxidation method. A non-doped amorphous silicon film 15-nm thick is then formed all over the semiconductor substrate 1. Subsequently, n-type impurities (such as phosphorous) are ion-implanted all over the surface layer of the semiconductor substrate 1 via the non-doped silicon film. The n-type impurities are controlled to have a density of 1E19 to 5E19 (atoms/cm$^3$). Heat treatment is then performed at 1000° C. for 10 seconds. This forms an n-type impurity diffused layer 6 on the surfaces of the active regions 1a and also transforms the amorphous silicon film to a polycrystalline silicon film (first silicon film) 5. The heat treatment can be performed at any later step. The impurity diffused layers 6 function as the source regions 6a and the drain regions 6b of the semiconductor device 100. The impurity diffused layers 6 are formed to have a depth of 50 nm from the surface 1b of the semiconductor substrate 1.

Turning to FIGS. 5A to 5F, a photoresist pattern (not shown) that covers the peripheral circuit region CA is formed by lithography to expose an upper surface of the polycrystalline silicon film 5 formed in the cell array region SA. The polycrystalline silicon film 5 exposed in the cell array region SA is then removed by the dry etching method using the photoresist as a mask. The photoresist mask is then removed. Accordingly, the polycrystalline silicon film 5 remains on the upper surface of the semiconductor substrate 1 in the peripheral circuit region CA with the first gate insulating film 4 interposed therebetween. The polycrystalline silicon film (first silicon film) 5 functions as a protection film for avoiding side effects on the peripheral circuit region CA at a later step of forming the cell array region SA. The polycrystalline silicon film 5 also functions as a part of a gate electrode in each planar transistor formed in the peripheral circuit region CA.

Turning to FIGS. 6A to 6F, a mask insulating film 7 composed of a silicon dioxide film 40-nm thick is formed all over the semiconductor substrate 1 by a plasma CVD method. A hard mask film 8 composed of an amorphous carbon film, an antireflection film, or the like is then formed. While the first gate insulating film 4 is formed on the upper surfaces of the active regions 1a in the cell array region SA at this stage, the first gate insulating film 4 has a quite small thickness of 3 nm, and therefore it is omitted in the following drawings as being combined with the mask insulating film 7.

While the same silicon dioxide film as that of the element isolation insulating film 3 is used for the mask insulating film 7 in the present embodiment, a problem mentioned below occurs if a silicon nitride film is used for the mask insulating film 7, for example. When wet etching with an HF-containing solution is performed at a stage shown in FIGS. 10A to 10F as a later step to form a saddle fin structure, only the element isolation insulating film 3 is set back and the silicon nitride film that covers the upper surface of the element isolation insulating film 3 remains like eaves because an etching rate of the silicon nitride film is lower than that of the silicon dioxide film constituting the element isolation insulating film 3. That is, an opening mouth has a width smaller than the internal width W2 of a third opening 9c. If a gate electrode to be buried is formed in this state, the opening mouth is closed before inside and thus a void is produced therein. That is, the gate electrode is insufficiently buried and resistance is increased. Therefore, in the present embodiment, it is necessary to select materials that can be etched at the same rate for the element isolation insulating film 3 and the mask insulating film 7. Alternatively, it is necessary to select an etching method that enables to etch the element isolation insulating film 3 and the mask insulating film 7 at the same rate even when different materials are used therefor.

Turning to FIGS. 7a to 7F, a photoresist pattern (not shown) is formed by lithography. The photoresist pattern is formed as a line pattern extending in the Y direction across the active regions 1a and the isolation regions 3a extending in the first direction. A width L1 in the first direction of the line pattern is 30 nm, for example, and the width W1 in the first direction of openings is 30 nm, for example. The hard mask film 8 is then etched by the anisotropic dry etching method using the photoresist pattern as a mask to transfer the line pattern. The photoresist pattern is then removed. Further, the mask insulating film 7 located therebeneath is subject to the anisotropic dry etching to form a mask film 8a composed of the hard mask film 8 and the mask insulating film 7. In this way, first openings 9a with the width W1 of 30 nm are formed between adjacent portions of the mask film 8a. The upper surfaces of the n-type impurity diffused layers 6, that is, the upper surfaces 1b of the active regions 1a and the upper surfaces of the isolation regions 3a are alternately exposed in the Y direction at the bottoms of the first openings 9a.

Turning to FIGS. 8A to 8F, the active regions 1a and the isolation regions 3a having the upper surfaces exposed are etched by the anisotropic dry etching method using the mask film 8a as a mask, thereby forming second openings 9b. A depth D1 of the second openings 9b from the upper surfaces 1b of the active regions 1a is 180 nm, for example. While the isolation regions 3a and the active regions 1a can be simultaneously etched by the anisotropic dry etching, it is more preferable that the isolation regions 3a are first etched and then the active regions 1a are etched. At a stage in which the isolation regions 3a that are 280-nm deep are formed on the semiconductor substrate 1, boundary surfaces between the isolation regions 3a and adjacent active regions 1a are formed to be slightly inclined toward the active regions 1a. Therefore, if the active regions 1a are first subject to the anisotropic dry etching, the isolation regions 3a constituting the inclined boundary surfaces adversely serve as masks and thus portions of the active regions 1a extending in the first direction under these masks remain unetched. Accordingly, a method of first performing the anisotropic dry etching of the active regions 1a and then performing the anisotropic dry etching of the isolation regions 3a is unfavorable. It is preferable that the active regions 1a and the isolation regions 3a are simultaneously etched or the isolation regions 3a are first subject to the anisotropic dry etching, as mentioned above. In the anisotropic dry etching of the element isolation insulating film 3 composed of the silicon dioxide film, gas plasma containing high-order fluorocarbon such as octafluorocyclobutane ($C_4F_8$) is used. In the anisotropic dry etching of the active regions 1a composed of silicon, gas plasma containing hydrogen bromide (HBr), chlorine ($Cl_2$), or oxygen ($O_2$) is used. By forming the second openings 9b, the impurity diffused layers 6 are divided into the source regions 6a and the drain regions 6b.

Turning to FIGS. 9A to 9F, among the mask film 8a used as the mask for forming the second openings 9b, the hard mask film 8 is selectively removed by dry etching using oxygen gas plasma. Accordingly, in the second openings 9b extending in the Y direction, first trench portions 91 are formed at portions overlapping with the active regions 1a and second trench portions 101 are formed at portions overlapping with the isolation regions 3a. At this stage, each of the first trench portions 91 consists of a first side surface composed of a side surface 7a of the mask insulating film 7 and the side surface 1aa of the active region 1a, a second side surface opposite to the first side surface and composed of a side surface 7b of the mask insulating film 7 and a side surface lab of the active region 1a, and the bottom surface lac composed of the active region 1a. Each of the second trench portions 101 consists of a first side surface composed of the side surface 7a of the mask insulating film 7 and a side surface 3ba of the isolation region 3a, a second side surface opposite to the first side surface and composed of the side surface 7b of the mask insulating film 7 and a side surface 3bb of the isolation region 3a, and a bottom surface 3bc composed of the isolation region 3a.

Turning to FIGS. 10A to 10F, the mask insulating film 7 and the element isolation insulating film 3 exposed in the second openings 9b are simultaneously etched by using isotropic etching. Dotted lines 80 in FIG. 10 indicate surface profiles in cross sections before the isotropic etching is performed (the same holds true for FIGS. 9A to 9F). At this etching step, a method that does not etch the silicon substrate 1 exposed in the second openings 9b needs to be used. If the silicon substrate 1 is etched together with the mask insulating film 7 and the element isolation insulating film 3, a fin structure cannot be formed. Because the mask insulating film 7 and the element isolation insulating film are made of the silicon dioxide film in the present embodiment, the silicon dioxide film needs to be isotropically etched with a higher selectivity than the silicon. As the isotropic etching, any of (1) a wet etching method using a hydrofluoric acid (HF)-containing solution, (2) an isotropic dry etching method using the gas plasma containing high-order fluorocarbon mentioned above, and (3) a chemical dry etching method using anhydrous hydrogen fluoride gas and ammonia gas can be used. In any method, an etching selectivity of the silicon dioxide film relative to the silicon can be 100 times or higher. For example, 0.1 nm or less of the silicon is etched during etching of 10 nm of the silicon dioxide film and substantially no silicon is etched.

From a viewpoint of etching the element isolation insulating film 3 and the mask insulating film 7 at the same rate, the element isolation insulating film 3 and the mask insulating film 7 are preferably made of the same material in the wet etching method (1) and the isotropic dry etching method (2). In the case of the chemical dry etching method (3), the element isolation insulating film 3 and the mask insulating film 7 can be made of different materials because, for example, the silicon dioxide film and the silicon nitride film can be etched at the same rate.

The chemical dry etching (3) using the anhydrous hydrogen fluoride gas and the ammonia gas is explained in more detail. The semiconductor substrate is installed in a reaction chamber and then left for about 60 seconds with a temperature kept in a range of 30 to 50° C. while supplying about 20 sccm of anhydrous hydrogen fluoride (HF) gas and about 20 sccm of ammonia ($NH_3$) gas controlled under a pressure atmosphere of 20 mTorr. This forms sublimable ammonium fluorosilicate on a surface of the silicon dioxide film. When the temperature is raised to 200° C. under an inert gas atmosphere of 650 mTorr, the ammonium fluorosilicate is sublimated and removed. An amount of the silicon dioxide film removed when the processing is performed once under this condition is 5 nm in thickness, which indicates that the silicon dioxide film can be removed with a quite high accuracy. While the silicon dioxide film has been explained above as an example, the silicon nitride film can be similarly etched. Even when this processing is performed, no ammonium fluorosilicate is formed on a surface of the silicon and thus the silicon is not removed at all. Although the chemical dry etching method itself is a known technique, it is an effective measure when applied to the saddle fin formation method of the present embodiment.

The wet etching method (1) of using the hydrofluoric acid (HF)-containing solution is explained below. This method can achieve ideal isotropic etching. In addition, only the silicon dioxide film can be selectively etched while the silicon is not etched. The temperature is not particularly limited and can be a room temperature. Because being both made of the silicon dioxide film, the mask insulating film 7 and the element isolation insulating film 3 can be etched at the same rate. In this example, 10 nm of the element isolation insulating film 3 and the mask insulating film 7 covering the upper surface of the element isolation insulating film 3 are etched.

Accordingly, the third openings 9c extending in the second direction are formed. The third openings 9c become the trench portions 9c for the buried gate electrodes. Focusing on the second trench portions 10 formed in the isolation regions 3a in the third openings 9c, the bottom surface 3bc before the wet etching is dug down (set back) by 10 nm in the depth direction to constitute a new bottom surface 3cc. That is, the new bottom surface 3cc is located at a position set back by 10 nm in the depth direction from the bottom surface 1ac of the first trench portion 9, and portions of the silicon substrate 1 constituting the active regions 1a protrude by $\Delta D$ (10 nm) from between adjacent portions of the new bottom surface 3cc, thereby forming the first fin portions 30a. Therefore, while a depth D1 of the bottom surface 1ac of the first trench portion 9 from the upper surface 1b of the semiconductor substrate 1 is maintained at 180 nm, a depth D2 of the new bottom surface 3cc of the second trench portions 10 from the upper surface 1b of the semiconductor substrate 1 is 190 nm because there is a change $\Delta D$ of 10 nm.

Meanwhile, the first side surface 3ba before the wet etching is set back by 10 nm in the first direction, thereby constituting a new side surface 3ca. That is, the new side surface 3ca is located at a position set back by 10 nm in the first direction from the side surface 1aa of the first trench portion 9, and portions of the silicon substrate 1 constituting the active regions 1a protrude by $\Delta W$ (10 nm) in the first direction from between adjacent portions of the new side surface 3ca, thereby forming the second fin portions 30b. Furthermore, the second side surface 3bb before the wet etching is set back by 10 nm in the first direction, thereby constituting a new side surface 3cb. That is, the new side surface 3cb is located at a position set back by 10 nm in the first direction from the side surface 1ab of the first trench portion 9, and portions of the silicon substrate 1 constituting the active regions 1a protrude by $\Delta W$ (10 nm) in the first direction from between adjacent portions of the new side surface 3cb, thereby forming the second fin portions 30b. The mask insulating film 7 is also etched by 10 nm and therefore the side surface 7a constituting the first side surface before the etching is set back in the first direction, thereby forming a new side surface 7aa flush with the new side surface 3ca constituted by the element isolation insulating film 3. The side surface 7b constituting the second side surface before the etching is set back in the first direction, thereby forming a new side surface 7bb flush with the new side surface 3cb constituted by the element isolation insulating film 3. Because the mask insulating film 7 is etched also from the upper surface, the thickness thereof, which is 40 nm at the time of formation, is reduced to 30 nm.

In the second trench portions 10, the width L1 of the lines and the width W1 of the second openings 9b, which are both 30 nm at the stage before the etching, are changed by $\Delta W$ of 10 nm due to the etching, so that a width L2 of the lines is 10 nm and a width W2 of the third openings 9c is 50 nm at a stage after the etching. Meanwhile, the width L1 of the lines and the width W1 of the second openings 9b in the first trench portions 9 do not change even after the etching. Therefore, a planar profile of the buried gate electrode trench portions 9c finally formed has a double-edged saw shape.

Turning to FIGS. 11A to 11F, surfaces of the first and second fin portions 30a and 30b exposed in the gate electrode trench portions 9c are thermally oxidized to form the gate insulating film 11 composed of a silicon dioxide film of 3-nm thick. A conducting material 12 composed of metal is then formed all over to fill the gate electrode trench portions 9c. The conducting material 12 is obtained by first forming a titanium nitride film of 5-nm thick serving as a barrier layer by the CVD method and then forming thereon a tungsten film of 30-nm thick by the CVD method. As described above, if the mask insulating film 7 remains like eaves at the opening mouths of the third openings 9c, voids (air gaps) are formed inside of the third openings 9c after the tungsten film is formed, which increases an entire resistance of conducting materials serving as the word lines. Furthermore, if there are voids, the tungsten film located under the voids and the silicon of the active regions 1a are also etched at a subsequent etchback step and thus a saddle fin structure (the first fin portions 30a) cannot be formed at the bottom. However, because the method of etching the mask insulating film 7 and the element isolation insulating film 3 at the same rate is used in the present embodiment, no eave of the mask insulating film 7 is produced and therefore no void occurs in the tungsten film, thereby avoiding the problem mentioned above.

Turning to FIGS. 12A to 12F, the conducting material 12 is etched back by the dry etching method using gas plasma containing boron trichloride ($BCl_3$) and chlorine to dig into the third openings 9c (the gate electrode trench portions 9c), thereby forming the buried gate electrodes (first conductors) 12a at the bottom of the gate electrode trench portions 9c. In the etching back, the upper surfaces of the gate electrodes 12a are formed at the positions not to overlap with the side surfaces of the source regions 6a and the drain regions 6b in the horizontal direction parallel to the upper surface 1b of the semiconductor substrate 1. Because the depth of the source regions 6a and the drain regions 6b from the surface 1b of the semiconductor substrate 1 is 50 nm, the upper surfaces of the gate electrodes 12a are formed to be deeper than 50 nm and shallower than 60 nm from the supper surface 1b of the semiconductor substrate 1. At this stage, the gate electrodes 12a have a double-edged saw structure extending in the Y direction in which the width W1 in the first direction of the first trench portions 9 in the active regions 1a is 30 nm and the width W2 in the first direction of the second trench portions 10 in the isolation regions 3a is 50 nm in a planar view, as shown in FIG. 12A.

Turning to FIGS. 13A to 13F, a silicon nitride film is formed by the ALD method all over the semiconductor substrate 1 to cover the upper surfaces of the gate electrodes 12a and to fill the trench portions 9c. The silicon nitride film is then etched back to the upper surface 1b of the semiconductor substrate 1 by the dry etching method using gas plasma containing trifluoromethane ($CHF_3$) and difluoromethane ($CH_2F_2$), thereby forming a cap insulating film 14. In this way, the cap insulating film 14 having the same double-edged saw shape as the gate electrodes 12a in a planar view is formed to cover the upper surfaces of the gate electrodes 12a. A first interlayer insulating film 15 composed of a silicon dioxide film is then formed and a surface thereof is planarized by the CMP method.

Turning to FIGS. 14A to 14F, the upper surfaces of the source regions 6a are exposed by using the lithography and the anisotropic dry etching method, thereby forming bit-line contact trenches 16 extending in the Y direction. Accordingly, the upper surfaces of the source regions 6a, the upper surface of the element isolation insulating film 3, and parts of the upper surface of the cap insulating film 14 are exposed at bottoms of the bit-line contact trenches 16. In the anisotropic dry etching, gas plasma containing high-order fluorocarbon and oxygen is used.

Turning to FIGS. 15A to 15F, an amorphous phosphorus-doped silicon film of 30-nm thick is formed all over the semiconductor substrate 1 to fill the bit-line contact trenches 16 with a width in the first direction of 30 nm. Heat treatment is then performed at 1000° C. for 10 seconds to cause the amorphous silicon film to become polycrystalline and activate phosphorus contained as impurities to become a conductor. The phosphorus-doped silicon film formed on the upper surface of the interlayer insulating film 15 is then removed by the CMP method. Accordingly, buried conductors (second conductors) 17a that bridge the bit-line contact trenches 16 are formed. A silicon film (second silicon film) 17b serving as a part of the gate electrode of each peripheral circuit transistor is formed in the peripheral circuit region CA.

Turning to FIGS. 16A to 16F, a metallic film 18a is formed all over the semiconductor substrate 1. The metallic film 18a is composed of a titanium silicide film formed by the CVD method, a titanium nitride film formed by the CVD method, a tungsten silicide film formed by the spattering method, and a tungsten film formed by the spattering method. A cover insulating film 19 composed of a silicon nitride film is further laminated on an upper surface of the metallic film 18. The cover insulating film 19 and the metallic film 18a are etched by lithography and the anisotropic dry etching method, thereby forming bit lines 18 extending in an X direction (third direction) perpendicular to the Y direction (second direction). The buried conductors 17a formed in the bit-line contact trenches 16 and having upper surfaces exposed are then etched using the cover insulating film 19 as a mask. Accordingly, bit-line contact plugs 17 are formed beneath the bit lines 18 in the bit-line contact trenches 16. The bit lines 18 and the source regions 6a are connected via the bit-line contact plugs 17. Side surfaces of the bit lines 18 facing in the Y direction and side surfaces of the bit-line contact plugs 17 facing in the Y direction are flush. In the peripheral circuit region CA, a gate electrode 20 of each planar transistor is formed of a first gate electrode 17c composed of the first silicon film 5 and the second silicon film 17b, and a second gate electrode composed of the metallic film 18a formed in the same layer as the bit lines 18. A photoresist pattern covering the cell array region SA is then formed and n-type impurities are implanted in the peripheral circuit region CA using an ion implantation method, thereby forming a source diffusion layer 21 and a drain diffusion layer 22 of each planar transistor.

Turning to FIGS. 17A to 17C, a side wall insulating film 23 that protects side walls of the bit lines 18 and the gate electrodes 20 in the peripheral circuit region CA is formed and also a second interlayer insulating film 24 is formed to cover the bit lines 18 and the planar transistors. Capacitive contact holes are then formed to expose the upper surfaces of the drain region 6b by lithography and the anisotropic dry etching method. The capacitive contact holes are then filled with a third conductor to form capacitive contact plugs 25. Lower electrodes 26 connecting to the capacitive contact plugs are then formed, a capacitive insulating film (not shown) is formed, an upper electrode 27 is formed, a third interlayer insulating film is formed, contact plugs 29 are formed, and upper layer wirings 30 are formed, thereby manufacturing a DRAM semiconductor device.

While the height ΔD of the first fin portions 30a extending in the direction parallel to the upper surface of the semiconductor substrate 1 and the width ΔW in the first direction of the second fin portions 30b extending in the direction perpendicular to the upper surface of the semiconductor substrate 1 are the same and 10 nm in the present embodiment, the present invention is not limited thereto. In FIGS. 9A to 9F, the element isolation insulating film 3 can be previously dug deeper than the active regions 1a by the anisotropic dry etching method at the stage of forming the second openings 9b extending in the second direction, and then the isotropic etching can be performed to obtain the height ΔD of the first fin portions 30a larger than the width ΔW in the first direction of the second fin portions 30b. For example, when additional etching of 10 nm is performed by the isotopic etching in a state where the bottom surface 3bc of the element isolation insulating film 3 is formed at a position that is 10 nm deeper than the bottom surfaces lac of the active regions 1a at the stage of the anisotropic dry etching, the height ΔD of the first fin portions 30a can be 20 nm and the width ΔW in the first direction of the second fin portions 30b can be 10 nm.

In addition, while not specifically claimed in the claim section, the applicant reserves the right to include in the claim section of the application at any appropriate time the following devices:

A1. A semiconductor device comprising:
a plurality of element isolation regions extending in a first direction in parallel on a semiconductor substrate;
a plurality of active regions of the semiconductor substrate each sandwiched between adjacent two of the element isolation regions;
a plurality of trenches extending in the second direction across the element isolation regions and the active regions, each of the trenches having a plurality of first trench portions crossing the active regions and a plurality of second trench portions crossing the element isolation regions, the first trench portions having bottom surfaces positioned at higher than bottom surfaces of the second trench portions so that each of the active regions have a plurality of first fin portions formed on the bottom surfaces of the first trench portions protruding with respect to the bottom surfaces of the second trench portions, and the second trench portions having a width in the first direction wider than a width of the first trench portions in the first direction so that each of the active regions have a plurality of second fin portions formed on side surfaces of the first trench portions protruding with respect to the side surfaces of the second trench portions;
a plurality of conductive films each buries a lower portion of an associated one of the trenches; and
a plurality of cap insulating films each covers an upper surface of an associated one of the conductive films so that the cap insulating films bury upper portions of the trenches.

A2. The semiconductor device as described in A1, further comprising a plurality of mask films extending in the second direction across the element isolation regions and the active regions formed at outside of the trenches.

A3. The semiconductor device as described in A2, wherein the mask films have substantially constant width in the first direction.

A4. The semiconductor device as described in A2, wherein the mask films comprise substantially the same material as the element isolation regions.

A5. The semiconductor device as described in A2, wherein the mask films and the element isolation regions comprise a silicon dioxide.

A6. The semiconductor device as described in A2, wherein the mask films comprise different material from the cap insulating films.

A7. The semiconductor device as described in A6, wherein the mask films comprise a silicon dioxide, and the cap insulating films comprise a silicon nitride.

A8. The semiconductor device as described in A1, wherein the cap insulating film has substantially the same planer shape as that of the conductive film.

B1. A semiconductor device comprising:
first and second element isolation regions extending in a first direction;
an active region sandwiched between the first and second element isolation regions in a second direction intersecting with the first direction;
a trench extending in the second direction formed in the first and second element isolation regions and the active regions;
a conductive film formed at a lower portion of the trench; and
a cap insulating film formed at an upper portion of the trench, the cap insulating film having substantially the same planer shape as that of the conductive film.

B2. The semiconductor device as described in B1, wherein the trench has a first trench portions crossing the active regions and second trench portions crossing the first and second element isolation regions,
the first trench portion has bottom surface positioned at higher than bottom surfaces of the second trench portions so that the active region have a first fin portion formed on the bottom surfaces of the first trench portions protruding with respect to the bottom surfaces of the second trench portions, and
the second trench portions have a width in the first direction wider than a width of the first trench portion in the first direction so that the active region has second fin portions formed on side surfaces of the first trench portion protruding with respect to side surfaces of the second trench portions.

B3. The semiconductor device as described in B1, wherein the conductive film has an upper surface that is positioned lower than upper surfaces of the first and second element isolation regions.

B4. The semiconductor device as described in B3, wherein the cap insulating film has an upper surface that is positioned at substantially the same plane as the upper surfaces of the first and second element isolation regions.

B5. The semiconductor device as described in B2, further comprising a gate insulating film provided between the conductive film and the first and second fin portions.

B6. The semiconductor device as described in B5, wherein the conductive film serves as a gate electrode of a field effect transistor, and the first and second fin portions serve as a channel region of the field effect transistor.

What is claimed is:

1. A manufacturing method of a semiconductor device, the method comprising:
forming a plurality of element isolation regions extending in a first direction in parallel on a semiconductor substrate so that a plurality of active regions each sandwiched between adjacent two of the element isolation regions are defined in the semiconductor substrate, each of the element isolation regions having an element isolation insulating film filling an isolation trench formed in the semiconductor substrate, and the active regions being arranged at a predetermined pitch in a second direction intersecting with the first direction;
forming a plurality of gate trenches extending in the second direction across the element isolation regions and the active regions, each of the gate trenches having a plurality of first trench portions crossing the active regions and a plurality of second trench portions crossing the element isolation regions, the first trench portions having bottom surfaces positioned at higher than bottom surfaces of the second trench portions so that each of the active regions have a plurality of first fin portions formed on the bottom surfaces of the first trench portions protruding with respect to the bottom surfaces of the second trench portions, and the second trench portions having a width in the first direction wider than a width of the first trench portions in the first direction so that each of the active regions have a plurality of second fin portions formed on side surfaces of the first trench portions protruding with respect to the side surfaces of the second trench portions;

forming a plurality of conductive films each buries a lower portion of an associated one of the gate trenches; and forming a plurality of cap insulating films each covers an upper surface of an associated one of the conductive films so that the cap insulating films bury upper portions of the gate trenches.

2. The manufacturing method of the semiconductor device as claimed in claim 1, wherein the forming the trench portions includes:

forming first openings extending in the second direction across the element isolation regions and the active regions by an anisotropic dry etching method so that the bottom and side surfaces of the first and second trench portions are exposed; and etching the bottom and side surfaces of the second trench portions by isotropic etching method.

3. The manufacturing method of the semiconductor device as claimed in claim 2, wherein the forming the first openings includes:

forming a plurality of mask films extending in the second direction across the element isolation regions and the active regions; and etching the element isolation regions and the active regions using the mask films as an etching mask so that the first openings are formed.

4. The manufacturing method of the semiconductor device as claimed in claim 3, wherein the mask films comprise substantially the same material as the element isolation insulating films.

5. The manufacturing method of the semiconductor device as claimed in claim 4, wherein the mask films and the element isolation insulating films comprise a silicon dioxide.

6. The manufacturing method of the semiconductor device as claimed in claim 3, wherein the mask films comprise different material from the cap insulating films.

7. The manufacturing method of the semiconductor device as claimed in claim 6, wherein the mask films comprise a silicon dioxide, and the cap insulating films comprise a silicon nitride.

8. The manufacturing method of the semiconductor device as claimed in claim 1, wherein the conductive films and the cap insulating films fill the gate trenches.

9. A manufacturing method of a semiconductor device, the method comprising:

forming first and second element isolation regions extending in a first direction in a semiconductor substrate so that an active region of the semiconductor substrate sandwiched between the first and second element isolation regions in a second direction intersecting with the first direction is defined;

forming first and second films extending in the second direction over the first and second element isolation regions and the active region, each of the first and second films having a lower film and an upper film;

anisotropic etching the first and second element isolation regions and the active region using the upper films as an etching mask so that a first trench portion is formed in the active region and second trench portions are formed in the first and second element isolation regions;

removing the upper films so that the lower films are exposed; and isotropic etching the first and second element isolation regions and the lower films so that a first fin portion is formed on a bottom surface of the first trench portion protruding with respect to bottom surfaces of the second trench portions, and so that second fin portions are formed on side surfaces of the first trench portion protruding with respect to side surfaces of the second trench portions.

10. The manufacturing method of the semiconductor device as claimed in claim 9, wherein the lower films comprise substantially the same material as the first and second element isolation regions.

11. The manufacturing method of the semiconductor device as claimed in claim 10, wherein the lower films and the first and second element isolation regions comprise a silicon dioxide.

12. The manufacturing method of the semiconductor device as claimed in claim 9, the method further comprising forming a conductive film in the first and second trench portions.

13. The manufacturing method of the semiconductor device as claimed in claim 12, the method further comprising forming a gate insulating film between the conductive film and the first and second fin portions.

14. The manufacturing method of the semiconductor device as claimed in claim 13, wherein the conductive film serves as a gate electrode of a field effect transistor, and the first and second fin portions serve as a channel region of the field effect transistor.

15. The manufacturing method of the semiconductor device as claimed in claim 12, wherein the conductive film has an upper surface that is positioned lower than upper surfaces of the first and second element isolation regions.

16. The manufacturing method of the semiconductor device as claimed in claim 15, the method further comprising forming a cap insulating film on the conductive film.

17. The manufacturing method of the semiconductor device as claimed in claim 16, wherein the cap insulating film has an upper surface that is positioned at substantially the same plane as the upper surfaces of the first and second element isolation regions.

18. The manufacturing method of the semiconductor device as claimed in claim 16, wherein the cap insulating film has substantially the same planer shape as that of the conductive film.

19. The manufacturing method of the semiconductor device as claimed in claim 16, wherein the lower films comprise a silicon dioxide, and the cap insulating film comprising a silicon nitride.

20. The manufacturing method of the semiconductor device as claimed in claim 16, wherein the upper films comprise neither a silicon dioxide nor a silicon nitride.

* * * * *